United States Patent [19]

Ericsson

[11] Patent Number: 4,816,914
[45] Date of Patent: Mar. 28, 1989

[54] METHOD AND APPARATUS FOR EFFICIENTLY ENCODING AND DECODING IMAGE SEQUENCES

[75] Inventor: S. Staffan Ericsson, Manchester, Mass.

[73] Assignee: PicTel Corporation, Peabody, Mass.

[21] Appl. No.: 1,326

[22] Filed: Jan. 7, 1987

[51] Int. Cl.[4] .............................................. H04N 7/12
[52] U.S. Cl. .................................... 358/133; 358/135
[58] Field of Search ............... 358/136, 135, 105, 133, 358/280, 141; 382/50

[56] References Cited

U.S. PATENT DOCUMENTS

| | | | |
|---|---|---|---|
| T928,003 | 11/1974 | Bahl et al. | 235/154 |
| 3,830,966 | 8/1974 | Alrich et al. | 78/6 |
| 4,091,424 | 5/1978 | Widergren | 358/260 |
| 4,150,401 | 4/1979 | Yamamoto et al. | 358/260 |
| 4,179,709 | 12/1979 | Workman | 353/133 |
| 4,222,076 | 9/1980 | Knowlton | 358/263 |
| 4,261,018 | 4/1981 | Knowlton | 358/263 |
| 4,276,544 | 6/1981 | Iinuma | 340/347 DD |
| 4,302,775 | 11/1981 | Widergren et al. | 358/136 |
| 4,363,036 | 11/1982 | Subramaniam | 358/261 |
| 4,369,463 | 1/1983 | Anastassiou et al. | 358/135 |
| 4,394,774 | 7/1983 | Widergren et al. | 382/56 |
| 4,420,771 | 12/1983 | Pirsch | 358/261 |
| 4,430,748 | 2/1984 | Tuhro et al. | 382/50 |
| 4,447,886 | 5/1984 | Meeker | 364/725 |
| 4,476,484 | 10/1984 | Haskell | 358/11 |
| 4,486,785 | 12/1984 | Lasher et al. | 358/284 |
| 4,528,693 | 7/1985 | Pearson et al. | 382/47 |
| 4,535,352 | 8/1985 | Haskell | 358/16 |
| 4,541,012 | 9/1985 | Tescher | 358/133 |
| 4,563,671 | 1/1986 | Lim et al. | 340/347 DD |
| 4,574,379 | 3/1986 | Eng et al. | 370/104 |
| 4,578,704 | 3/1986 | Gharavi | 358/135 |
| 4,580,162 | 4/1986 | Mori | 358/135 |
| 4,581,638 | 4/1986 | Chiariglione et al. | 358/135 |
| 4,583,237 | 4/1986 | Haskell | 375/27 |
| 4,589,110 | 5/1986 | Eng et al. | 370/118 |
| 4,589,372 | 7/1986 | McRoberts | 364/518 |
| 4,593,318 | 6/1986 | Eng et al. | 358/142 |
| 4,628,829 | 12/1986 | Hauck | 358/260 |
| 4,646,356 | 2/1987 | Anderson et al. | 358/260 X |
| 4,672,441 | 6/1987 | Haelzlwimmer et al. | 358/136 X |

FOREIGN PATENT DOCUMENTS 0123456 10/1984 European Pat. Off. .

OTHER PUBLICATIONS

"Overview of Digital Facsimile Coding Techniques in Japan" Yasuda, IEEE Proceedings, vol. 68, #7, Jul. 1980, pp. 830–844.

Cohen et al., "Hierarchical Coding of Binary Images," *IEEE Transactions on Pattern Analysis and Machine Intelligence*, vol. PAMI-7, No. 3, May 1985, pp. 284–298.

Wilson, "Quad-Tree Predictive Coding: A New Class of Image Data Compression Algorithms," CH1945-5/84/0000-0312, 1984 *IEEE*.

Primary Examiner—James J. Groody
Assistant Examiner—Victor R. Kostak
Attorney, Agent, or Firm—Hale and Dorr

[57] ABSTRACT

A method and apparatus, for encoding transform coefficient data representing an error or a motion description of each of a plurality of blocks in one image frame of a timed sequence of image frames, identify those blocks for which data will be transmitted, quad-tree encode, and then variable length encode the locations of the blocks. The bit rate can be controlled by varying the quantization of the encoded data and preferably quantization step size is predicted prior to encoding the data. Further, the quad-tree encoding process can be terminated after the coding process generates a selected number of bits. At the receiver, the method and apparatus provide a multiple lookup table method for decoding the variable length coded data.

30 Claims, 8 Drawing Sheets

| SYMBOL | CODE |
|---|---|
| A | 00 |
| B | 01 |
| C | 100 |
| D | 1010 |
| E | 1011 |
| F | 1100 |
| G | 1101 |
| H | 11100 |
| J | 11101 |
| K | 111100 |
| L | 111101 |
| M | 1111100 |
| N | 1111101 |
| P | 1111110 |
| Q | 1111111 |

…

METHOD AND APPARATUS FOR EFFICIENTLY ENCODING AND DECODING IMAGE SEQUENCES

BACKGROUND OF THE INVENTION

The invention relates generally to data communication and signal processing methods and apparatus, and in particular to a method and apparatus for reliably and efficiently encoding and decoding sequences of image data, for example, that transmitted through a 56 kilobit per second telephone communications channel.

The transmission of sequences of images, and in particular sequences of naturally occurring images such as those represented by a television signal, has been the subject of a significant amount of investigation. Typically, investigators have relied upon the highly redundant nature of successive images in the sequence and have often modeled the image data as a Markov process with a correlation coefficient close to unity. The three-dimensional Markov model provides a motivation for utilizing differential pulse-code-modulation (DPCM) and transform coding techniques to take account of the interframe redundancy.

By analyzing the nature of typical moving video, it is easy to become convinced that the principal change occurring between successive frames is the inhomogeneous motion of the objects within the frame. It has also been recognized that an accurate apparatus and method of estimating and compensating for this spatially dependent motion enables the construction of an interframe data compression method and apparatus which can have substantially better performance than can be achieved by sending a signal representative merely of the difference between successive frames.

As a result, various motion compensating coding methods and apparatus have been developed. These systems typically are either receiver-based motion compensation systems or transmitter-based motion compensation systems. In the receiver-based motion compensation system, the receiver makes a prediction as to the motion and compensates the previous frame for the expected motion. The transmitter, operating in the same manner, then sends only an error signal describing what must be done at the receiver in order to correct the receiver predicted frame. The error signal is typically coded in order to reduce its bandwidth.

For a transmitter-based motion compensation system, the motion estimation process occurs only at the transmitter. Displacement vectors are generally determined over various regions of the image and this data is then transmitted to the receiver along with an error information data signal. At the receiver the compensation process is performed on the previously coded image first using the motion information provided by the transmitter. The error signal data provided by the transmitter is then added to the thus compensated receiver image in order to maintain picture quality.

There is thus typically provided for a transmitter-based motion compensation system a plurality of displacement vectors, and in at least one preferred embodiment, each vector is associated with a specific region or block of the image. The blocks are typically non-overlapping and have, for example, a size of eight picture elements (pixels) by eight picture elements. Various methods have been employed for encoding the motion compensation data associated with each of the blocks. Hinman, in his co-pending application U.S. Ser. No. 740,898, filed June 3, 1985, the contents of which are incorporated herein, in their entirety, by reference, describes a lossy coding method for encoding the motion-compensation displacement information. While these methods are highly advantageous, and provide excellent results, it is nevertheless desirable to further improve the compression of the data information and thereby enable high quality image reproduction using still less channel bandwidth. It is further desirable to provide better control over the data transmission by controlling, for example, the bit rate associated with the image and the ease of decoding the resulting coded data stream.

It is therefore an object of the present invention to transmit sequences of images over a communications channel using relatively low bandwidth, and providing high reliability and fidelity. Other objects of the invention are a motion compensation encoding and decoding method and apparatus which reliably transmit and receive an accurate estimate of the displacement of the pixels of a scanned image in a sequence, and an improved motion estimation encoding and decoding method and apparatus which enable real-time, reliable, and accurate determination of regional displacement in an image transmission device.

SUMMARY OF THE INVENTION

The invention, in one aspect, relates to a method and apparatus for encoding transform coefficient data associated with the transform of an image frame, the coefficient data being represented in a two-dimensional array. The method features the steps of identifying those coefficients which will be transmitted to a receiver; quad-tree encoding the array locations of those coefficients which will be transmitted; and encoding, using a variable length coding procedure, the quad-tree data code words.

In a preferred embodiment, the method further features subjecting the coefficients to a quantizing process for reducing the number of coefficients to be transmitted whereby the coefficient data of the image is represented by fewer data bits as the quantizer step size increases.

The quad-tree encoding method, in another aspect of the invention, further features the steps of assigning a selected number of bits to the quad-tree encoding step, performing the quad-tree encoding of the transform coefficients from low to high frequency representing components, and terminating the quad-tree encoding when the selected number of code bits has been exhausted.

In another aspect of the invention, the method further features predicting a quantization step size for an image from available image statistics, and prior to encoding the image. According to one aspect of the illustrated embodiment of this method, the quantization step size is dependent upon the quantization step size for the previous image, the number of blocks completely coded in the previous image, a minimum number of blocks to be coded in the present image, a total prediction error energy for the present image frame, and a total prediction error energy for the previous image frame. In another aspect, the quantization step size is dependent upon the energy of the motion signal.

In yet another aspect of the invention, the method relates to decoding, at a receiving station, variable length coded data. The decoding step features the steps of applying a received data stream to at least a first and second lookup table, setting a flag whenever the variable length code word cannot be decoded using only the first lookup table, and decoding the variable length code word using the other lookup table(s) whenever the flag is set. If the flag is not set, only the first lookup table is employed. In the illustrated embodiment there are two lookup tables. The first lookup table is responsive to a first number of sequentially received bits of each variable length code word beginning at the first received bit of each word, the first number of bits being less than the length of the longest variable length code word. The second lookup table is responsive to a second number of sequentially received bits of each variable length code word beginning after the first bit of each code word. The second number of bits is less than the length of the longest variable length code word and the sum of the first and second numbers of bits is at least equal to the length of the longest variable length code word.

In one particular aspect, the invention relates to a method for encoding motion estimation transform data representing the motion of each of a plurality of blocks, the blocks collectively representing an image frame in a time sequence of image frames. The transform data for each block is arranged in a two-dimensional array and each block has associated therewith a motion transform data signal representing the motion estimate for that block. The method features the steps of identifying those blocks for which motion estimation transform data will be transmitted, quad-tree encoding the locations of those blocks for which motion estimation data will be transmitted, and encoding, using a variable length coding procedure, the quad-tree encoded data code words. In one preferred aspect, the value of the motion estimation transform data associated with each quad-tree data identified block will be encoded using a variable length code.

The apparatus, in one aspect, features circuitry for identifying those coefficients which will be transmitted to a receiver, quad-tree encoding circuitry for coding the array locations of those coefficients which will be transmitted, and coding circuitry for variable length coding the quad-tree data code words.

In a particular aspect of the apparatus, the identifying circuitry features circuitry for subjecting the coefficients to a quantizing process for reducing the number of coefficient data bits to be transmitted whereby the coefficient data of the image is represented by fewer data bits as the quantizer step size increases.

In yet another aspect of the invention, the apparatus quad-tree encoding circuitry features assignment circuitry for assigning a selected number of bits to the quad-tree encoding process, circuitry for performing the quad-tree encoding of transform coefficients from low to high frequency representing components, and circuitry for terminating operation of the encoding process when that previously selected number of bits has been exhausted.

In yet another aspect of the invention, the apparatus selecting circuitry features circuitry for predicting the quantization step size prior to encoding the image. In one aspect, the step size is based upon the quantization step size the previous image frame, the number of blocks completely coded in the previous image frame, a minimum number of blocks to be encoded in the present frame, a total prediction error energy for the present frame, and a total prediction error energy for the previous frame.

In yet another particular aspect of the invention, the apparatus further features decoding circuitry, at the receiver, for decoding variable length coded data. The decoding circuitry applies a received data stream to at least a first and second lookup table, sets a flag whenever the variable length code word cannot be decoded using only the first lookup table, and decodes the variable length code word, when the flag is set, using the other lookup table(s). When the flag is not set, the decoding circuitry uses the first lookup table. In the illustrated embodiment, two lookup tables are employed. The first lookup table is responsive to a first number of sequentially received bits of each variable length code word, beginning at the first received bit of the code word. The first number of bits is smaller than the length of the longest variable length code word. The second lookup table is responsive t a second number of sequentially received bits of each variable length code word beginning after the first bit of the code word. The second number of bits is less than the length of the longest variable length code word and the sum of the first and the second numbers is at least equal to the length of the longest variable length code word.

The apparatus of the invention features circuitry for identifying those blocks for which motion estimation transform data will be transmitted, quad-tree coding circuitry for coding the locations of those blocks for which motion estimation transform data will be transmitted, and variable length coding circuitry for coding the quad-tree encoded data code words. In one preferred embodiment, the apparatus further encodes, using a variable length code, the value of the motion estimation transform data for each quad-tree data identified block.

BRIEF DESCRIPTION OF THE DRAWINGS

Other objects, features, and advantages of the invention will appear from the following description of particular preferred embodiments taken together with the drawings in which.

DESCRIPTION OF PARTICULAR PREFERRED EMBODIMENTS

Figure 1:
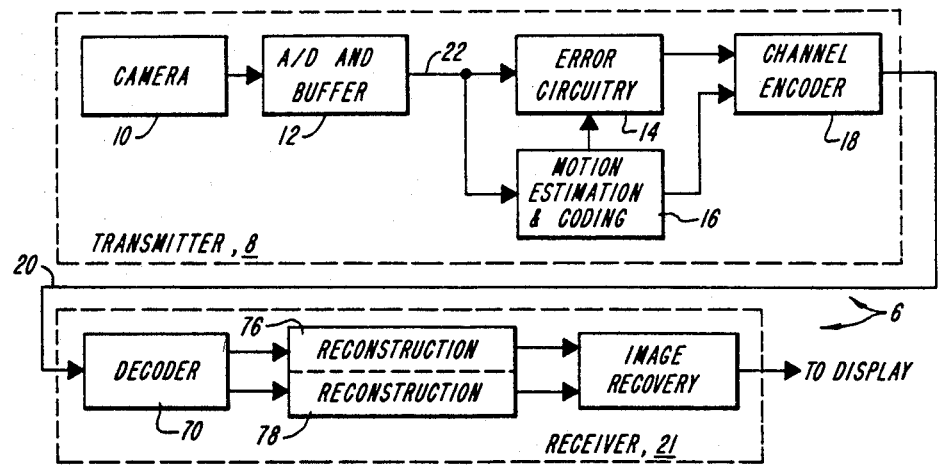
FIG. 1 is an electrical block diagram of a typical image communications system in accordance with the claimed invention.

Referring to FIG. 1, a communications system 6 has a transmitter 8 which, in accordance with a preferred embodiment of the invention, has a camera 10 for providing a video signal to an analog-to-digital converter and frame buffer 12. The frame buffer portion of the analog-to-digital converter and frame buffer 12 is capable of storing a full frame of the video, sampled to, for example, eight bits across a 256×240 pixel raster.

The entire coding and motion compensation process takes place in the digital domain. The transmitter has an error signal circuitry 14 and a motion estimation and coding circuitry 16. A channel encoder 18 channel encodes the outputs of the error circuitry 14 and motion estimation and coding circuitry 16 and passes the thus encoded data onto a channel 20 for transmission to a receiver 21.

Figure 2:
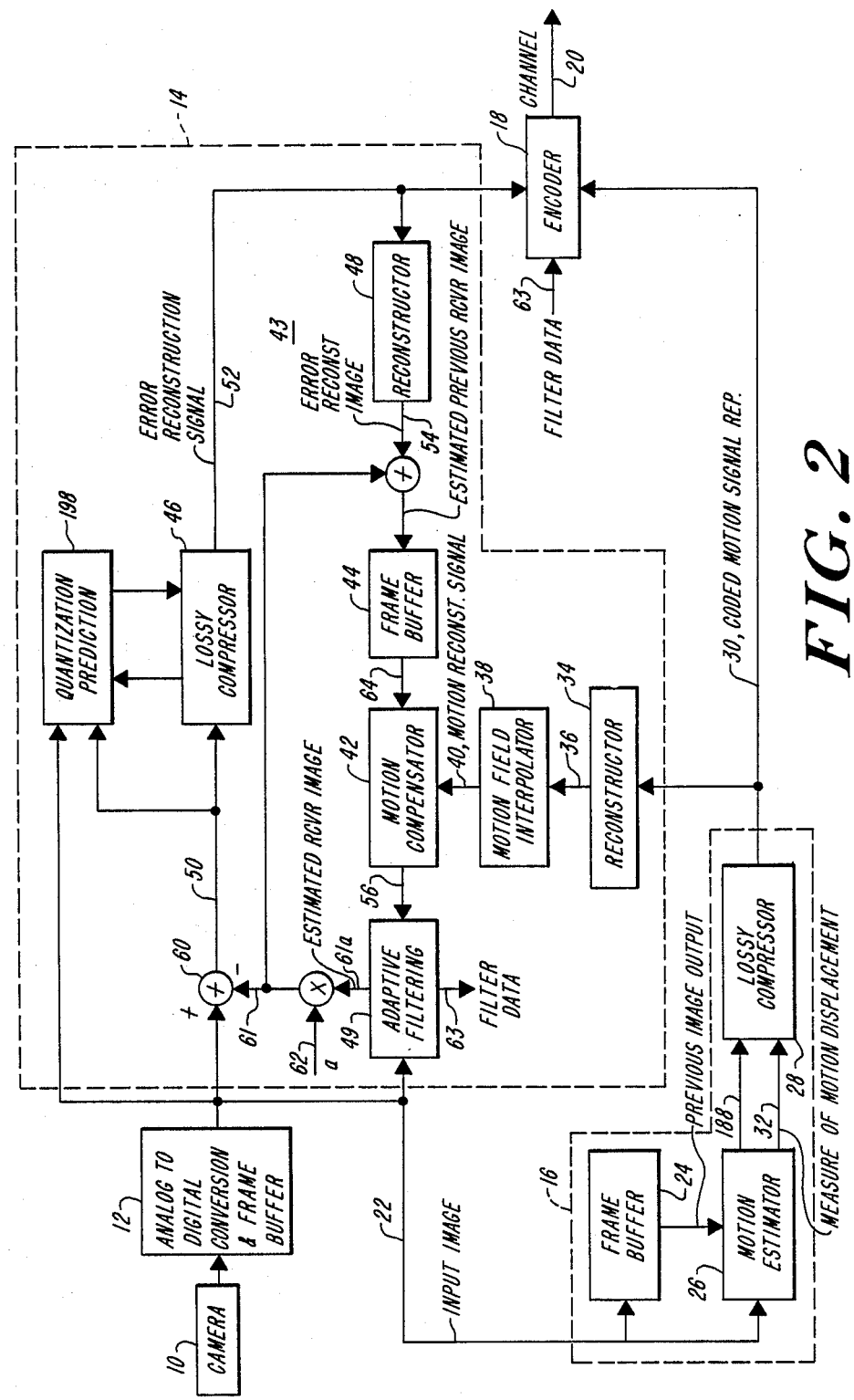
FIG. 2 is an electrical block diagram of the transmitter of a motion-compensated image encoding apparatus employing the invention.

The illustrated motion estimation and coding circuitry 16 of FIG. 1, in accordance with a preferred embodiment of the invention, and referring to FIG. 2, compares a present original input frame image, available over lines 22, with the previous original input image, available in this illustrated embodiment from a frame buffer 24. A motion estimator circuitry 26 generates a measure of the motion displacement between the frames input thereto, and can be any of a number of motion estimation devices as are well known in the art. In a preferred embodiment to be described hereinafter, the motion estimation device uses an adaptive steepest descent error minimization method to generate the motion displacement measures.

The output of the motion estimator 26 is a field of motion vectors which, as noted above, provide a measure of the motion displacement between input frames. This vector field provides a description of how to map a previous input frame or input image from buffer 24 into the best approximation of the present input frame or image over lines 22. By "best" is meant an error metric such as, for example, a mean-squared-error error measure. Typically, and in the illustrated embodiment, the motion estimator uses a region matching technique between non-overlapping blocks of the previous and present input images. Should motion occur for a region in the previous image, the estimator will determine which block in the present image is the best match for the block in the previous image, and the value of the displacement is the difference between a new coordinate pair for the block in the present image and the original coordinate pair for the block in the earlier image. That determination defines the motion vector to be associated with the block in the previous image.

Since scenes are generally composed of several large objects moving uniformly over time, there is a high degree of correlation in the motion vector field. To avoid transmitting redundant information, and to reduce the data bit requirements, the preferred embodiment of the invention modifies the motion vector field, thereby losing some information, to facilitate the compression of the motion representing data. In the illustrated embodiment, this operation is represented by a "lossy compressor" 28 which reduces the amount of data, and hence the bandwidth, required to represent the motion vector field. Noting the similarity between motion vector field and natural images, predictive, transform, or interpolative coding of the two independent components of the vector field can be employed by the lossy compressor 28.

Thus the lossy compressor circuitry 28 is employed for coding the motion vector field available over lines 32, and provides, over lines 30, a coded motion signal representative of the motion vectors. This output of the lossy compressor, as noted above, will not, upon decoding, exactly reproduce the signals over lines 32 (which provide the measure of motion displacement) and, therefore, have some error signal associated with them. Nevertheless, the reduction in the data requirements of a lossy compressor, when compared to, for example, a PCM exact coding method, are so substantial, that the use of a lossy compressor, is a significant advance in the art. One preferred lossy compression circuitry employs a discrete cosine transform and the circuitry incorporates a processing method described in co-pending application, U.S. Ser. No. 740,806, entitled Method and System for Adapting a Digitized Signal processing System for Block Processing With Minimal Blocking Artifacts and filed on June 3, 1985. The inventor is Henrique Malvar. That application, assigned to the assignee of the present application, is incorporated herein, in its entirety, by reference.

The lossy compressor circuitry 28, in the illustrated embodiment of the invention, provides for block transformation and includes additional circuitry for reducing the number of bits (the bandwidth) required to describe the transformed motion vector field. The lossy compressor can thus provide for varying the quantization step size (and, if necessary, the threshold) with which the transform coefficients which define the motion vector field are "digitized," thereby reducing the number of output bits as either the quantization step size or the threshold (or both) increase in value. The lossy compressor also preferably employs quad-tree encoding followed by a variable length encoding which enables substantial reduction, on the order of twenty to thirty percent, in output bits, over, for example, the output of the system described in the co-pending application of Hinman, Ser. No. 740,898, entitled "A Method and Apparatus for Efficiently Communicating Image Sequences," filed June 3, 1985. That application, assigned to the assignee of the present application, is incorporated herein, in its entirety, by reference. The quad-tree encoding further provides a natural method for controlling the bit rate from the apparatus. Thus, the apparatus can select a maximum number of output bits for a frame which will be transmitted to the channel encoder 18 over lines 30, and once that number of bits has been reached, the quad-tree encoding process can terminate. This has the effect of eliminating, in particular in the spatial domain, those higher frequency components of the motion vectors, that is, the more detailed information with regard to the image being transmitted.

The output of the lossy compressor circuitry over lines 30, as noted above, is passed to the encoder 18. In addition, those signals are employed by the error circuitry 14 for determining what the receiver would have seen, absent any errors in the channel, and thereby providing the mechanism for determining the prediction error signal, that is, the signal representing the difference between what the receiver would have predicted based upon the coded motion signal representation over lines 30, and the true image input.

The output of the lossy compressor over lines 30 is used by a reconstructor circuitry 34 for producing, at its output, a signal representative of the measure of motion displacement, the motion vectors, on lines 32. The difference between the signals over lines 36, the output of the reconstruction circuitry, and the signals over lines 32, represents the coding error introduced by the lossy compression apparatus 28. The output of the reconstruction apparatus 34, over lines 36, is directed to a motion field interpolation circuitry 38 which operates in the spatial domain to associate with each picture element a motion displacement vector. Thus, while the input signals over lines 36 represent motion displacements for groups or regions of elements, for example, the picture elements of a 4×4 block, the motion field interpolator, as described in more detail below, resolves that data so that there is associated with each picture element, a motion displacement vector. The resulting output of the motion field interpolator, over lines 40, is designated the motion reconstruction signal.

The motion reconstruction signal is applied to a motion compensation apparatus 42 which forms part of an error reconstruction loop 43. The error reconstruction loop includes a frame buffer 44, a lossy compression circuitry 46, a reconstruction circuitry 48, and a selectively operable adaptive filter 49. The input to the lossy compression circuitry 46, over lines 50, is the error signal which is to be transmitted to the receiver. That error signal is coded to reduce its bandwidth and the resulting signal, the error reconstruction signal over lines 52, is delivered to the channel encoder 18. The lossy compressor 46 can be any of the two-dimensional block encoders which can employ a uniform quantization step size. The output of the block transform can be advantageously further reduced in bandwidth and encoded according to the processes described above in connection with the lossy compressor 28. Thus, for example, quad-tree encoding followed by a variable length encoding method can be advantageously employed for further reducing the bandwidth of the output from the lossy compressor 46. Similarly, prediction and control of the threshold and quantization step size applied to the transform coefficients describing the output of the lossy compressor processing can control the bit rate output over lines 52 of the lossy compressor 46.

The error reconstruction signal is also sent to the reconstruction apparatus 48 which provides the inverse operation of the lossy compressor 46. There results, therefore, at the output of the reconstruction apparatus 48, an error reconstruction image over lines 54. The error reconstruction image is added to the expected output of the motion compensator, (which is the estimated receiver image over lines 61) and the resulting signal, an estimated previous receiver image (the predicted receiver image for the previous frame), is stored in the frame buffer 44.

The estimated receiver image is also applied to a differencing apparatus 60 which takes the difference between what the receiver is expected to predict, the signal over lines 61, and the actual image available from A-D converter and frame buffer 12. The output of the differencing apparatus 60 is the error signal input to the lossy compressor 46 over lines 50. If desired, a "leak" constant, "a", can be used to multiply the output of the adaptive filter 49 over lines 61a by a factor less than or equal to 1. This factor, "a," is indicated at 62 and provides for gradually eliminating the effect of errors in the channel.

The output of motion compensator 42 represents the predicted receiver image as a result of reconstructing the output data from lossy compressor 28. For those blocks wherein the motion compensation data is accurate, the signal over lines 56 is applied directly, by the adaptive filter 49, to its output over lines 61a. For those blocks for which motion compensation is not adequate, as described in more detail below, the adaptive filter can, in effect, low-pass filter the output data over lines 56 and provides over lines 61a, for those regions wherein filtering is advantageous, a low-pass version of the motion compensation reconstructed receiver image. In addition, the adaptive filter provides filter data, over lines 63, to the channel encode for transmission to the receiver.

As noted above, the input to the frame buffer 44 is the estimated previous receiver image. This receiver image, which takes into account all data received by the receiver, corresponds to the reconstructed receiver image for a frame. The image output from the frame buffer over lines 64 is the image which the motion compensation circuitry 42 modifies in accordance with the output of the motion field interpolator 38 over lines 40.

Figure 3:
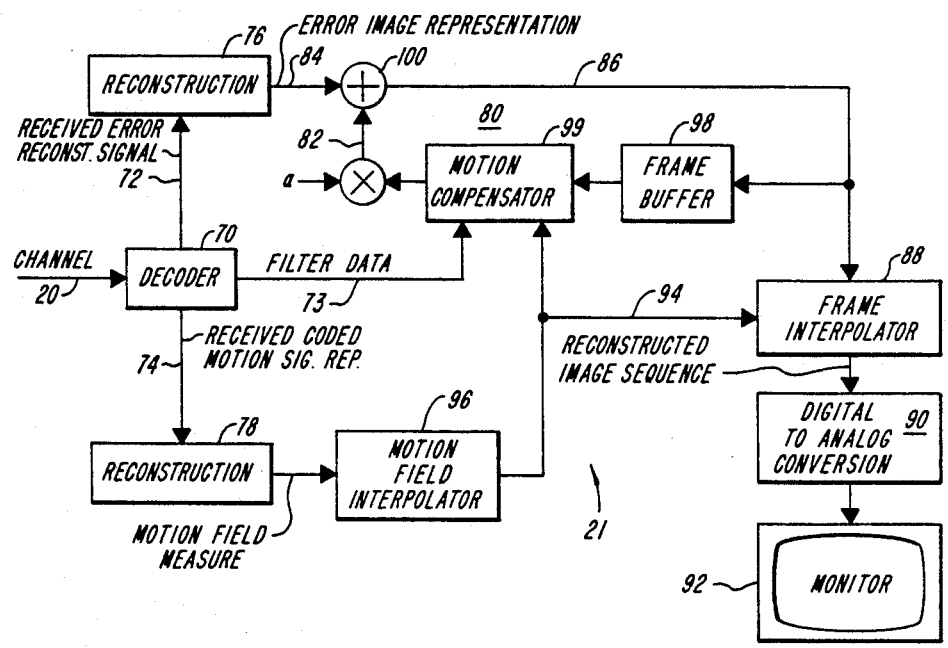
FIG. 3 is an electrical block diagram of the receiver of a motion-compensated image coding system for receiving the channel signals from the transmitter of FIG. 2.

At the receiver 21, referring to FIG. 3, the data from the channel is decoded by a channel decoder circuitry 70 and the resulting receiver error reconstruction signal over lines 72 and filter data signal over lines 73, and receiver coded motion signal representation over lines 74 are delivered to reconstruction circuitry 76, motion compensator 99, and reconstruction circuitry 78 respectively. The reconstruction circuitries 76 and 78 each provide for a unique multiple table lookup method for decoding the variable length codes as described in more detail hereinafter. The output of the error reconstruction circuitry 76 is delivered to a recovery loop 80 in which motion compensating signals over lines 82 are added to the error image representation over lines 84 to produce a reconstructed receiver signal over lines 86. That signal is delivered to a temporal frame interpolator 88, which can add one or more frames between the successive received frames over lines 86, for delivery to a digital-to-analog circuitry 90 and from there to a monitor 92 for viewing.

The frame interpolator 88 interpolates in the temporal domain in accordance with motion reconstruction signals received over lines 94. Those signals are generated by a motion field interpolator 96 corresponding to the motion field interpolator 38 of the FIG. 2. That motion field interpolator, as noted above, provides a motion vector for each picture element of the image and hence allows the frame interpolator to accurately predict what the image would have been at any selected time between received frames. The reconstructed receiver images over lines 86 are successively stored in a frame buffer 98 and are delivered to a motion compensator 99 which also receives signals from the motion field interpolator 96. The output of the motion compensator, representing the expected receiver image in the absence of an error correction, corresponds to the signal over lines 61a in the transmitter, and is delivered to the adder 100 for combination with the output of the error reconstruction circuitry over lines 84. As before, the output of the motion compensator circuitry can be modified by a "leak" parameter, "a," whereby the effects of errors in the channel can be slowly eliminated. (The "leak" parameter, "a," for both the transmitter and receiver must be identical in value.)

Figure 4:
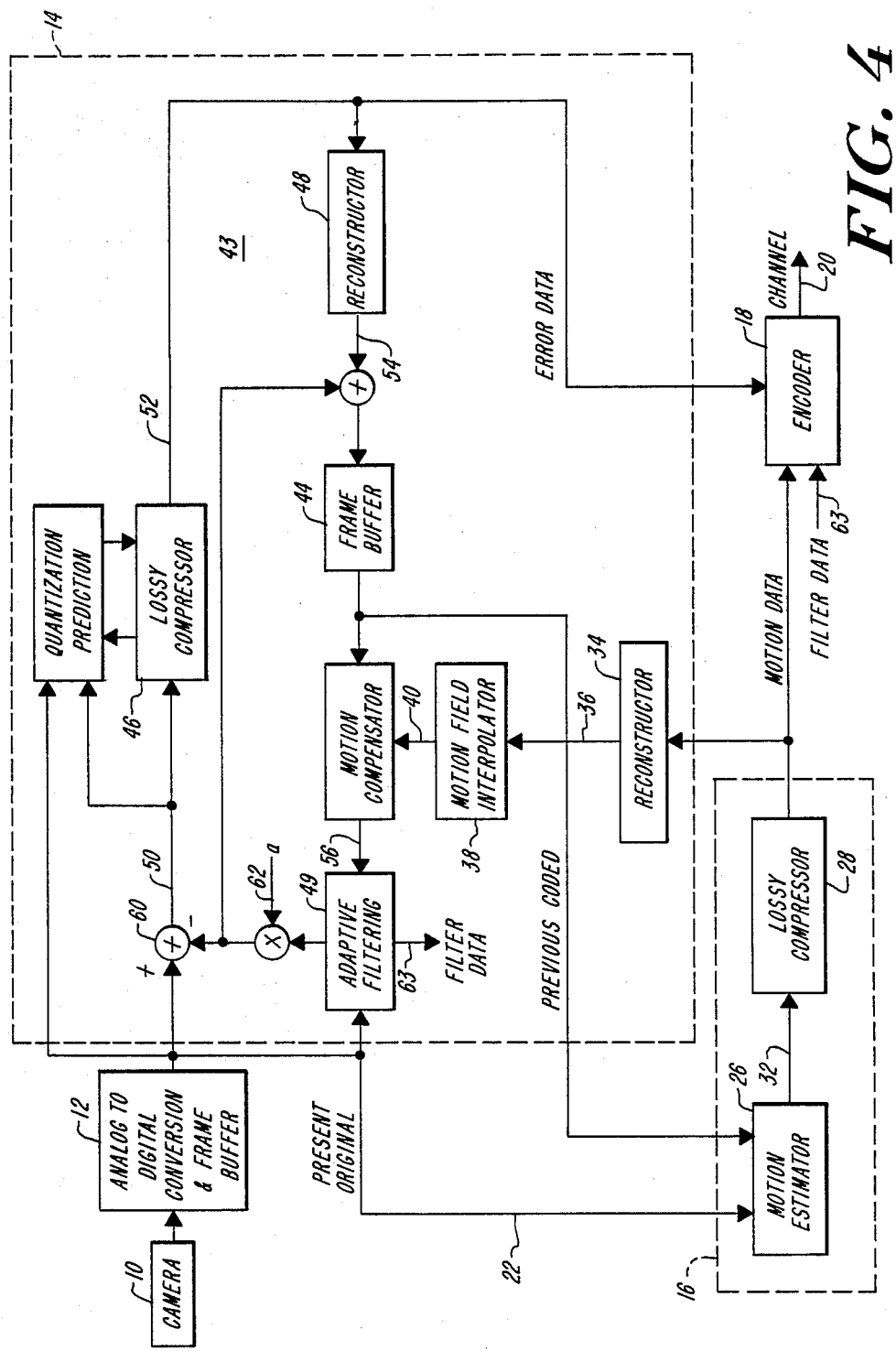
FIG. 4 is an electrical block diagram of an alternate transmitter circuitry for employing the invention.

Referring to FIG. 4, in an alternative embodiment of the invention, the motion estimation circuitry 26 can receive an input image corresponding to the previous frame, not from the frame buffer 24 which provides an open loop circuitry, but from the frame buffer 44 to provide closed loop operation. In certain aspects of operation, such closed loop operation is effective for reducing overall error. This, however, is not always true. The alternate input to the motion estimation circuitry 26 is, in the FIG. 4 embodiment the predicted reconstructed, previous frame output at the receiver.

Figure 5:
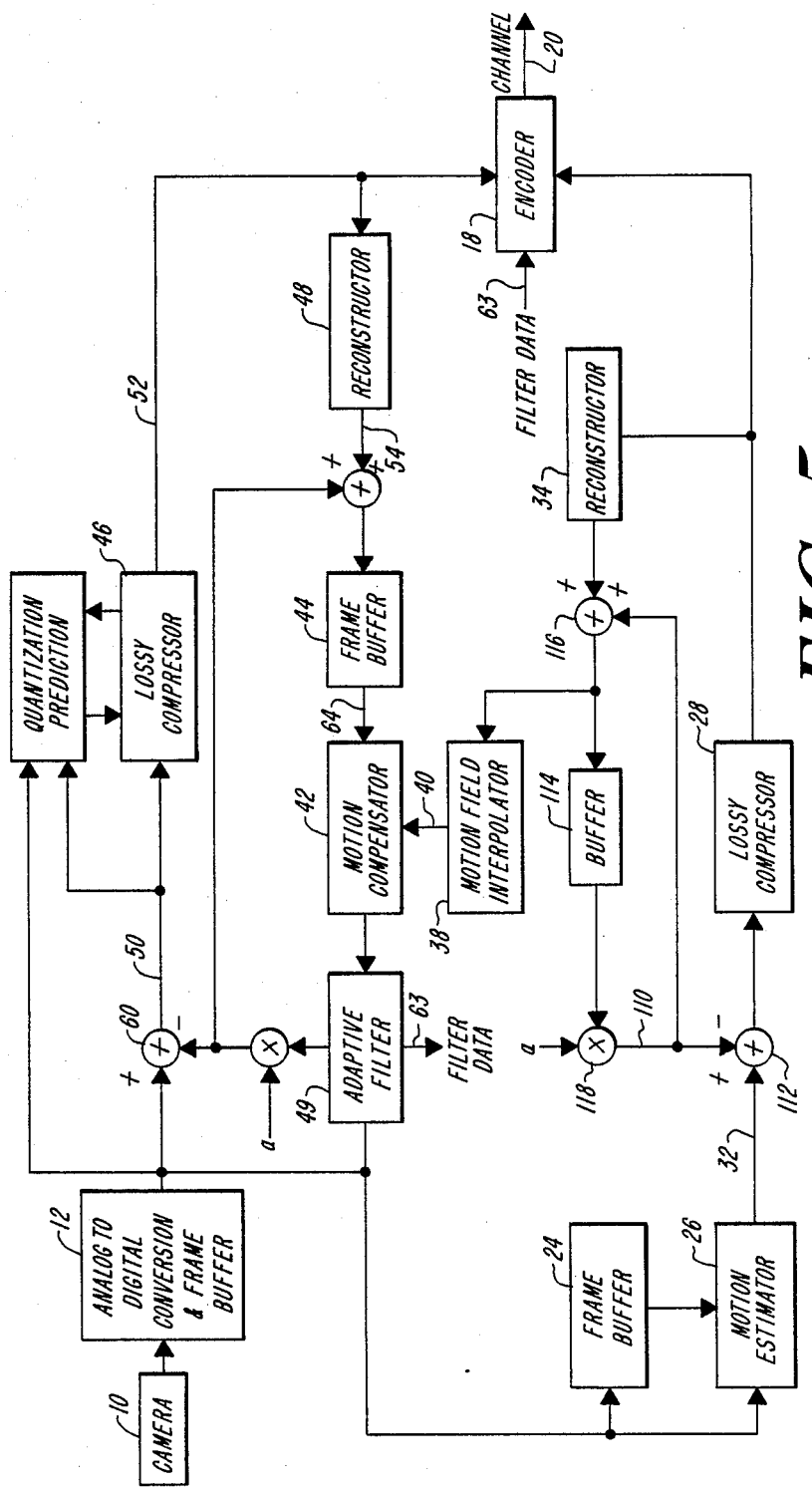
FIG. 5 is an electrical block diagram of the transmitter of a motion-compensated image coding system utilizing temporal DPCM coding and employing the invention.

Referring now to FIG. 5, the transmitter can employ a temporal differential pulse code modulation of the output of the motion estimator circuitry 26. In this illustrated embodiment, the lossy compressor input is no longer received directly from the motion estimator circuitry 26 as in the FIG. 2 embodiment, but instead is a differential signal corresponding to the difference between the estimated reconstructed signal for the previous frame, available over lines 110, and the present motion displacement vector signal over lines 32. These two signals are differenced at an adder 112 and that difference is passed to the lossy compressor circuitry 28, operating as described in connection with FIG. 2. The output of the reconstruction circuitry 34 is modified, in this illustrated embodiment, by the previous output of the reconstruction circuitry as is available from a buffer circuitry 114. These two signals are added at 116. The output from adder circuitry 116 is a coded motion signal representation corresponding to that available in the illustrated FIG. 2 embodiment over lines 36. The loop can compensate for channel error using the multiplication circuitry 118 having a "leak" parameter, a, which can range between 0 and 1.

Figure 6:
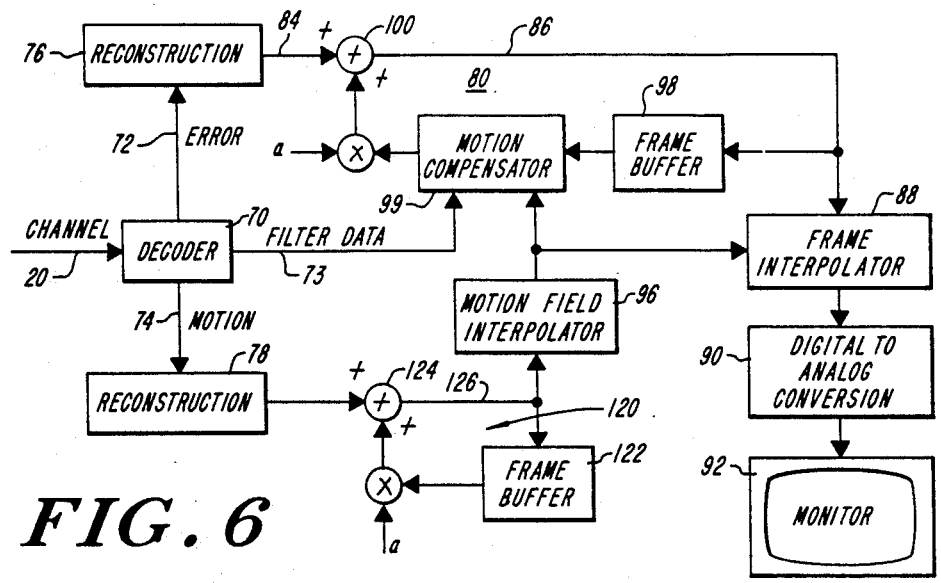
FIG. 6 is an electrical block diagram of the receiver of a motion-compensated coding system utilizing temporal DPCM coding for receiving the coded data of the transmitter of FIG. 5 and utilizing the invention.

Referring to FIG. 6, the receiver structure for the transmitter of FIG. 5 employs a differential loop 120 having a frame buffer 122 for storage of the reconstructed motion displacement vector signals from reconstruction apparatus 78. The receiver, thus, adds, using an adder 124, to the output of the reconstruction circuitry 78, the previous motion displacement vector which is stored in buffer 122. The result, over lines 126, is directed to the motion field interpolator 96. As before, a "leak" parameter, "a," can be employed to remove, over time, channel errors in the reconstruction signal.

THE MOTION FIELD INTERPOLATOR (38, 96)

Figure 7:
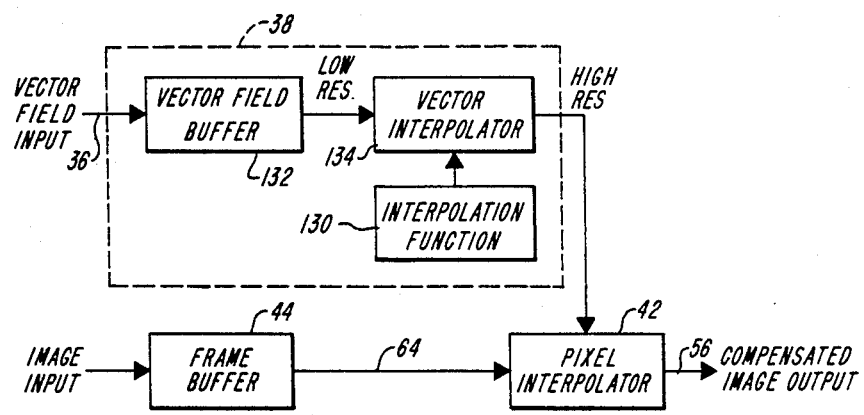
FIG. 7 is an electrical block diagram of a motion-compensation apparatus for a field of undersampled motion vectors.

Referring to FIG. 7, the motion field interpolator 38 receives from the reconstruction circuitry 34, a motion displacement vector over lines 36 for each block region of the image. For example, for a color television video signal, a typical luminance image can have a block size of $8 \times 8$ pixels while a typical chrominance image can have a block size of $4 \times 4$ pixels. The motion field interpolator, employing a selected interpolation method, then associates with each pixel of the frame, an interpolated motion vector displacement value.

In accordance with the preferred aspect of the invention, a raised cosine interpolation function is employed for associating with each pixel a displacement value. The interpolation function is stored at 130. The input vector field is stored in a buffer 132 and has a low resolution corresponding to the block size.

Thus, in accordance with this aspect of the invention, each displacement vector from reconstruction circuitry 34 is associated with the center of a multi-pixel region. Thus, for a $4 \times 4$ block region, referring to FIG. 8, the interpolation vectors are associated with a center position, that is, positions 400, 402, 404 which are not, for a $4 \times 4$ block, associated with any one picture element. The interpolation process, performed by a vector interpolator 124 operates in both the X and Y directions. Thus, the displacement vector associated with the $4 \times 4$ pixel block region centered at 400 and the corresponding displacement vector associated with the region centered at 402, for example, can be interpolated with respect to the X direction, while the displacement vectors at regions centered at 400 and at 404 can be employed with respect to a Y interpolation. In general, the interpolation process employs a plurality of displacement vectors surrounding a point of interest for deriving the value of the displacement vector at the point. Thus, an X and Y interpolated displacement vector value is assigned by the vector interpolator 134 in accordance with the interpolation function being used for each pixel of the image. In other embodiments of the invention, interpolation functions other than the raised cosine can be employed. For example, a linear interpolation function, or a trapezoidal shaped interpolation function can be employed, the latter for reducing the computational load.

The output of the transmitter motion field interpolator 38, or the receiver motion field interpolator 96 (which operates in a manner identical to that of interpolator 38), is directed to the full motion compensation circuitry 42 in the transmitter and to the full motion compensation circuitry 80 and frame interpolation circuitry 88 in the receiver. The full motion compensation circuits 42 and 80, using incoming frame image data from frame buffers 44 and 98 respectively and the motion field interpolator output data, produce, in the transmitter, the estimated receiver image over lines 56, and in the receiver, the received estimated image over lines 82. The motion compensation circuitry maps each output pixel location to a location in the previous frame as indicated by the displacement vector value associated with that output pixel location. The displacement vectors are specified by the motion field interpolation circuitry associated therewith. In particular, referring to FIG. 7, this is the output of vector interpolator 134.

There results, however, for some coordinate locations of the new image field, a mapping from pixel coordinates in the previous frame which do not fall upon a grid location. That is, the interpolated motion displacement vector may call for a movement of, for example, $1\frac{1}{4}$ picture elements. In these instances, the motion compensation apparatus employs a spatial (or pixel) interpolation, for example a linear spatial interpolation of the $2 \times 2$ block of pixels surrounding the noninteger location, for determining a pixel value from the previous frame. Other interpolation functions could, of course, be employed, for example, the value selected for the noninteger coordinate of the previous frame can be the value of the pixel closest thereto. Alternately, a raised cosine interpolation function can be employed.

In the illustrated embodiment of the invention, the receiver also employs the output of motion field interpolator to create one or more frames between those which are actually transmitted. In accordance with this aspect of the invention, the temporal frame interpolator 88, in the illustrated embodiment, receives the values of the motion field interpolation circuitry to determine the image values for a frame positioned in time, in the particular illustrated embodiment, one-half the distance between the transmitted and received frames. In the illustrated embodiment, this function is performed by halving the output displacement vectors from the motion field interpolator 96. Thus, if a picture element, from one transmitted frame to the next, were displaced two pixel positions in the X direction and 4 pixel positions in the Y direction, the temporal frame interpolator would provide an intermediate frame wherein that picture element was displaced one position in the X direction and two positions in the Y direction. In this manner, a frame half way between two received frames can be added to the picture image sequence to provide a better visual rendition.

The motion field interpolator 38 and motion compensator 42 can be implemented in hardware, in software, or in a combination of hardware and software. Attached hereto as Appendix B is a software implementation of a color video signal processing apparatus wherein the luminance (8×8 block regions) and chrominance (4×4 block regions) signals are processed.

The Lossy Compressor (28, 46)

In accordance with a preferred embodiment of the invention, the lossy compression circuitries 28 and 46 employ a block transform encoding method for coding the motion estimation output signal and the error signal over lines 50, respectively.

The output of the motion estimation circuitry 26 has the appearance, in essence, of a highly correlated image wherein each picture element represents not a portion of a visual image but, rather, a displacement value.

In the illustrated embodiment of the invention, the lossy compression circuitries 28 and 46 can employ a discrete cosine transform. Circuitry 28, then, for example, operates on the displacement vector output of the motion estimation circuitry 26 to provide coefficient data which is then adaptively subjected to a threshold and uniform quantization process. In this circumstance, the reconstruction circuitry 34 then employs the inverse discrete cosine transform as is well known in the art.

In yet another aspect of the invention, and as described the above-noted co-pending application U.S. Ser. No. 740,806, filed in the name of Henrique Malvar, on June 3, 1985, and assigned to the assignee of this invention, preprocessing techniques can be employed for improving even more upon the transform method described hereinabove, to substantially eliminate the block coding artifacts. In still another embodiment of the invention, the lossy compressor can be implemented using a short-space Fourier transform, such as that described in U.S. application Ser. No. 713,478, filed on Mar. 19, 1985, for a Method and Apparatus for Multi-Dimensional Signal Processing Using a Short-Space Fourier Transform, and assigned to the assignee of the present invention. The disclosure and specification of the above identified United States patent applications are incorporated herein, in its entirety, by reference.

Figure 15:
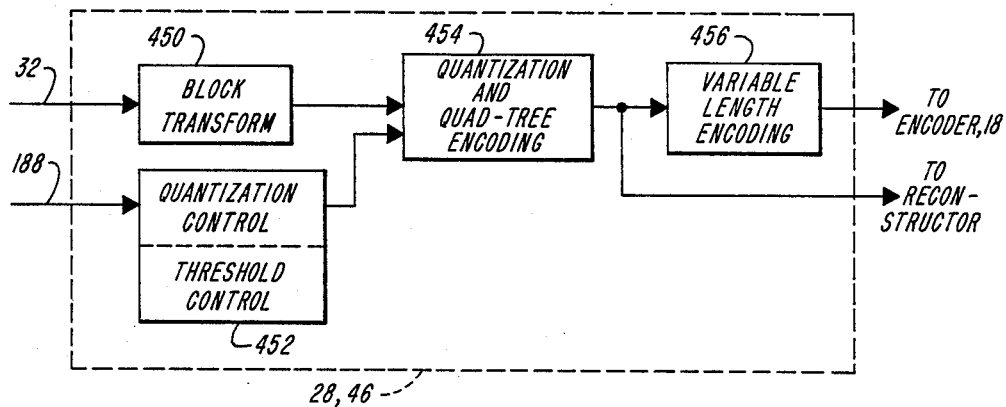
FIG. 15 is a block diagram of the lossy compressor according to the invention.

The lossy compression circuitry 28, as well as lossy compression circuitry 46, each contain data bandwidth compression elements for controlling and reducing the bit rate output applied and directed to the channel encoder 18. Referring to FIG. 15, in accordance with the preferred embodiment of the invention, and examining the lossy compressor 28 in detail, lossy compressor 46 operating in an analogous manner, the block transformation 450 to which the input to the lossy compressor is subjected, provides that each block in a spatial domain be transformed into an array of transform coefficients (some or all of which may be zero). Those coefficients are then quantized, and if necessary subject to a thresholding process, to further reduce the number of non-zero coefficients. In accordance with the invention, an increased threshold value and/or an increased quantization step size, reduces the number of non-zero coefficients to be coded and further reduces the length of the code words required to describe the coefficients output by the block transform method.

In accordance with the preferred embodiment of the invention, the quantization step size for a frame is advantageously predicted prior to the encoding of the frame. A quantization prediction and control 452 is employed by the lossy compressor 28, in response to the energy in the motion signals as provided from motion estimator 26 over lines 188. The lossy compressor 46, however, generates its quantization prediction from a quantization prediction circuitry 198 which provides quantization step size data to quantization control circuitry 452. The quantization prediction circuitry 198 is dependent upon the previous state of the quantization step size, the number of blocks completely encoded in the previous frame (that is, an 8×8 pixel block); the number of blocks intended to be coded completely for the current frame (that is, the number of blocks having the highest priority coding requirement); the total image energy for the current frame; and the total image energy for the previous frame. The blocks having the highest error values are placed in a highest priority category.

Using the predicted quantization step size, the lossy compressor encodes, at 454, the remaining block transform coefficients using a quad-tree coding technique. This technique, as is well known in the art, is implemented in a top-down progression and details, at its lowest level, those array locations for which coefficient data will be transmitted. The apparatus variable length codes the output of the quad-tree coding, and preferably the coefficient values to be transmitted at 456, and provides the variable length code data to the channel encoder 18. (The lossy compressors provide the quad-tree encoded data to their respective reconstructors and the variable length encoded data only to the channel encoder.)

In operation, the coefficients of each transformed block selected to be updated are quantized using the predicted quantization step size, subject to initial thresholding; and thereafter, the coefficient array locations are coded using the quad-tree coding method. The compression process thus consists of several operations: quantization, reconstruction, code word generation, and bit stream generation. The quantization, reconstruction, and code word generation are, in the illustrated embodiment, performed together. The bit stream generation is performed after the quad-tree code words have been determined.

For each transform coefficient associated with a block, the coefficient value is, as noted above, subjected to a threshold cutoff value and then quantization. The quantizer employed herein is a uniform quantizer, and the threshold and quantizer step size can be determined as noted above. A typical threshold is 1.5 times the quantization step size and the expected peak to peak value of the signal to be quantized is, in the illustrated embodiment, divided into 256 equal steps. Each transform coefficient is first compared to the threshold value. If the value of the coefficient is greater than the threshold value (either positive or negative), then the coefficient is quantized and coded. If the value is below the threshold value, then the coefficient is set to zero and is not coded.

For the coefficients which are quantized, the value of the coefficient is multiplied by the inverse step size. If the resulting quantization value is, in the illustrated embodiment, greater than eight bits, the coefficient value is cut off to be the largest allowable eight bit value (+127 or −128 in the illustrated embodiment). This value is then used as an input to the amplitude code word lookup tables at the transmitter for deriving the transmitter variable length value. The eight bit code word value is also used at the transmitter to reconstruct the transform coefficient. The quantized coefficient value is multiplied by the step size and will be made available to the associated reconstructor, for example reconstructor 34 (for motion reconstruction) and to reconstructor 48 (for error image reconstruction), for each transmitted block. In the illustrated embodiment, the same threshold and quantizer step size is used for all coefficients associated with an image frame. In addition, the same code word lookup table is used for all coefficients of a frame.

The quantization of each transform coefficient is performed at 454 as part of the overall quad-tree coding process. The quad-tree codes identify the transform array location to which each of the transmitted amplitude code words corresponds. For each 2×2 coefficient array (in the illustrated embodiment there are sixteen of them arranged in an 8×8 coefficient array), a four bit number is generated which indicates which of the coefficients has been quantized. The order of the quad-tree coding is always in the ordinary scanning order (top left, top right, bottom left, bottom right). The four bit quad-tree word will be used as an input in a quad-tree code word lookup table for determining a variable length code as described hereinafter.

Figures 8, 11, 12, 13:
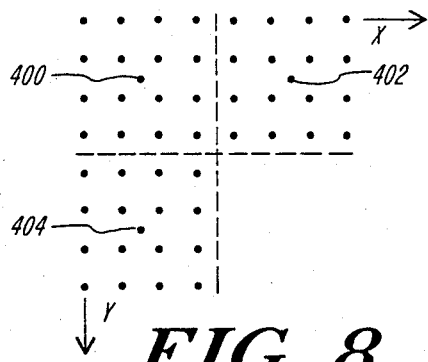
FIG. 8 is a diagrammatic representation of a spatial interpolation process.
FIG. 11 is a diagrammatic presentation of the relative locations of adjacent blocks used in predicting an initial displacement motion vector value.
FIG. 12 is a diagram showing a scanning pattern for quad-tree encoding according to one aspect of the invention.
FIG. 13 is a table of the variable length code words for an input data stream.

Referring to FIG. 12, the scanning order of the quad-tree coding imposes an overall order to coefficient quantization and code word generation. The coefficient quantization order is illustrated in the figure for an 8×8 coefficient array. In this illustrated embodiment, for each group of 2×2 lowest level "quads" (a "lowest level quad" consists of four coefficients in an array grouping, for example coefficients 1, 2, 3, and 4; and four lowest level quads arranged in a 2×2 array form the next higher level of quads, for example coefficients 1–16), another four bit quad-tree code word is generated to indicate if there are any coded coefficients in each of its four branches at this higher level. Each branch thus contains four coefficients. Finally, a top level quad-tree code word is generated by the same procedure wherein each code word bit relates to a sixteen coefficient array. For each of the three levels of the quad-tree in the illustrated embodiment, a different set of code word lookup tables is preferably employed.

As the quad-tree code words are generated, they are "placed," in the illustrated embodiment, in one of three code word lists. Thus, for each coded transform block, the code words associated therewith are appended to one of the lists. The first list, referred to as the 2×2 list, "contains" all code words corresponding to the first set of 2×2 coded coefficients (that is, the code words, if any, associated with coefficients 1, 2, 3, and 4 of FIG. 12). This includes the amplitude code words, if any, as well as the quad-tree code word for the 2×2 coefficient array. The next list, referred to as the 4×4 list, includes all code words in the first 4×4 coefficient array which are coded after the first 2×2 coefficient array has been completed. This includes the amplitude coefficient code words associated with coefficients 5 through 16, the three new 2×2 quad-tree code words, and the 4×4 quad-tree code word for the larger array including coefficients 1 through 16. The final list, referred to as the 8×8 list, includes all of the code words produced in connection with coefficients 17 through 64. The three code word lists, in the illustrated embodiment, do not actually contain the code words themselves, but a pointer to a code word and bit count lookup table. The pointer is the address of the first word of a two word block of data, the first word containing the code word itself and the second word the bit count for the code word.

As noted above, the lossy compressor provides for limiting the number of bits in each frame to a constant level. In view of the use of a variable length code, as described hereinafter, it is not possible to exactly predict the number of generated bits and the problem thus is not "trivial." The traditional approach of collecting the bit stream in a buffer and preventing overflow or underflow of the buffer by a feedback configuration has associated therewith a disadvantageously long buffer delay time. In accordance with the preferred embodiment of the invention, the predetermined number of bits is approximated by predicting the quantizer step size dependent, for lossy compressor 28, upon the motion frame energy, and for lossy compressor 46, upon the several parameters noted above. The ceiling on the number of bits to be transmitted is further met by limiting the quad-tree coding procedure, thereby cutting off, when necessary, the higher frequencies associated with the frame. The frequency cutoff is an operation which makes the image degrade in a "graceful" way, and the quad-tree coding method lends itself particularly well to the frequency domain control of the number of bits.

The coding method is performed on a priority basis. That is, the blocks are assigned to different categories by a separate decision process, each category reflecting the visual importance of updating the block. Within each category the lowest frequencies have the highest priority. Each category of block is then sent separately, the highest priority category being sent first. In each category, each block had been coded in the three separate passes outlined above (2×2, 4×4, and 8×8), that is, in order of lowest to highest frequency. Accordingly, the collection of blocks in a category corresponding to the 2×2 code word list is coded first; then the remaining blocks of the 4×4 code word list, and finally, the remainder of the blocks is coded (corresponding to the remaining blocks of the category found on the 8×8 code word list). The coding process continues in this top priority-down progression until the number of available bits has been exhausted.

When the code word lists have been completed, or when the number of allotted bits has been reached, the code words are concatenated into a single bit stream. The blocks are placed in the bit stream in the order in which they were produced. For each of the code word lists associated with a block, the code words are placed into the bit stream in reverse order; that is, the first code word placed in the bit stream is the last code word produced. This ensures decodability of the incoming bit stream. Thus, transmission for a block begins with the 8×8 quad code word followed by the remainder, if any, of the block description on the 8×8 list. Next the 4×4 list code word portion is transmitted, and finally the 2×2 list code word portion for the block.

The prediction of quantization step size, quad-tree encoding, and quad-tree decoding, can be implemented in hardware, in software, or in a combination of the two. Attached hereto as Appendices D, F, and G respectively, are software implementations of the methods.

RECEIVER VARIABLE LENGTH CODE WORD DECODING

The incoming bit stream at the receiver thus includes a number of variable length code word types. Typical decoding methods for variable length code require either time consuming serial decoding or a large decoding table. The invention herein uses the lookup table approach without the large hardware expense and is advantageously suitable to high speed decoding.

The variable length code word types include multiple levels of quad-tree code words and the amplitude code words. The first code word in the bit stream for each block is the top level quad-tree code word. The type of data in the code words that follow is dependent upon the value of that first code word. If the top level quad-tree code word indicates that the block does not contain any non-zero coefficients, then the next code word corresponds to the top level code word of the next block. If there are non-zero coefficients, then the data following the top level code word is the middle level quad-tree word. This is followed by the lowest level quad-tree word and finally by the amplitude word for the first coefficient. The order in which the coefficients and the quad-tree code words are decoded is thus the opposite of the order in which they are encoded. And, the order for each quad-tree level is a reverse scanning order (lower right, lower left, upper right, upper left). Tables 1, 2, 3, and 4 of Appendix E, describe the code word length and code word values for variable length coding 8×8 quad-tree code words, 4×4 quad-tree code words, 2×2 quad-tree code words, and amplitude coefficients respectively.

For each amplitude coefficient that is decoded, the amplitude value is placed in a transform block at the corresponding position. The amplitude value is obtained, as noted above in connection with the transmitter, by multiplying the decoded coefficient value from the amplitude code word decoding table by the quantization step size.

The variable length code word decoding method, according to the illustrated embodiment of the invention, employs multiple lookup table decoding. The quad-tree code word lookup table consists of a 256 entry length table, since the maximum length of the quad-tree code word is eight bits. A table entry includes the number of bits in the code word and the actual reconstructed four bit quad-tree word.

The maximum code word length for the amplitude code words is fourteen bits. Rather than use a 16,384 entry lookup table for decoding, two separate tables, each with 256 entries, are used according to the invention. The first amplitude code word lookup table determines, from the first eight bits of the code word, whether the code word is shorter or longer than eight bits. If the code word is shorter than eight bits, the reconstructed value is obtained directly from the first lookup table. If the code word is longer than eight bits, the last eight bits, in the illustrated embodiment, of the fourteen bit segment, are used in addressing a second lookup table to determine both the actual length and reconstructed value of the code word.

The use of multiple decoding tables assumes a specific structure for the Huffman code tree typically associated with variable length encoding. All code words that are too long to be decoded by the first table must have the same prefix. Given that they all start with an M-bit prefix, the second decoding lookup table does not need to look at those first M bits. The method is generally parallel in nature and hence can be used for the high speed application adopted here.

Figure 14:
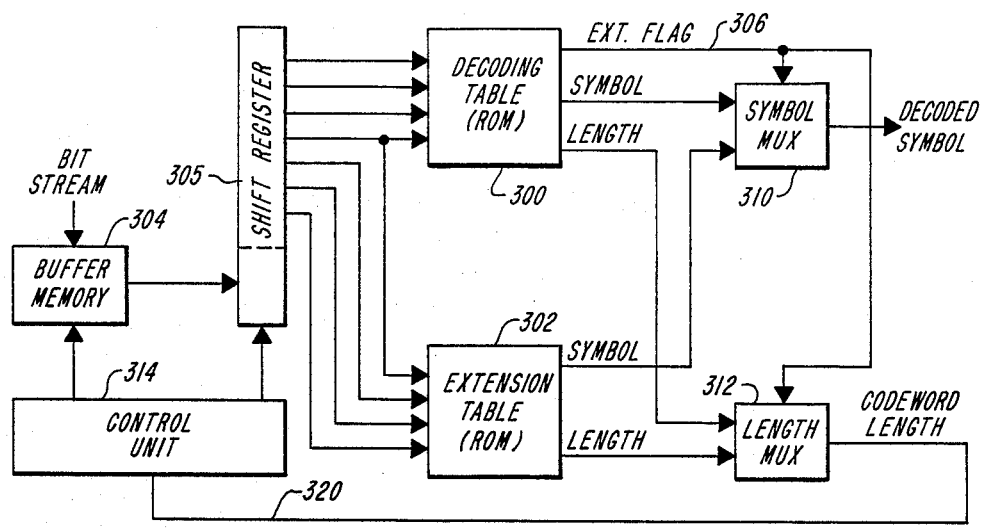
FIG. 14 is an electrical block diagram of one configuration of circuitry for decoding the variable length code words according to the invention.

The multi-stage decoding apparatus for decoding the Huffman variable length code of FIG. 13 is illustrated with reference to FIG. 14. The longest code word has a length N=7 bits. A two stage decoding circuitry, referring to FIG. 14, uses two tables, each having four bits of input. The tables are stored in RAM's 300, 302. Thus there are a total of sixteen entries for each table rather than the 128 entries required for a single decoding table. The first decoding table 300 looks at the first four bits of the bit stream from a buffer memory 304 and a shift register 305. If the symbol is at most four bits in length (corresponding to symbols A-G), it can be decoded by the first table.

All code words that are longer than four bits have the same three-bit prefix (111). If the first decoding table receives an input of 1110 or 1111, the second or extension lookup table is then employed as indicated by an extension flag over line 306. The extension table 302 examines bits four through seven and its output is valid when the first three bits are 111. This is indicated by the extension flag which can be set either explicitly as an output of the first decoding table as shown in FIG. 14 or through a logic circuitry which examines the output of the first lookup table and sets the flag whenever the output is for example all zeros. The output symbol and length data is available from multiplexors 310, 312. A control processor 314 controls shift register 305 and buffer 304 in response to code word length over lines 320.

Clearly, the illustrated decoding method can be extended to more than two tables. At their limits, when two lookup tables are employed, input bit lengths of "N1" and "N2," requires that "N1+N2" equal at least the length of the longest code word being received, that N1 and N2 each be less than the longest code word being received, and that the first lookup table examine the incoming code word beginning at the first bit of the word and that the second lookup table examine the incoming code word beginning no earlier than the second bit of the word and continuing to the end of the word.

The variable length decoding apparatus and method can be implemented in hardware, in software, and in a combination of the two. Attached hereto as Appendix H is a software implementation of the method.

The Motion Estimator

Figure 9:
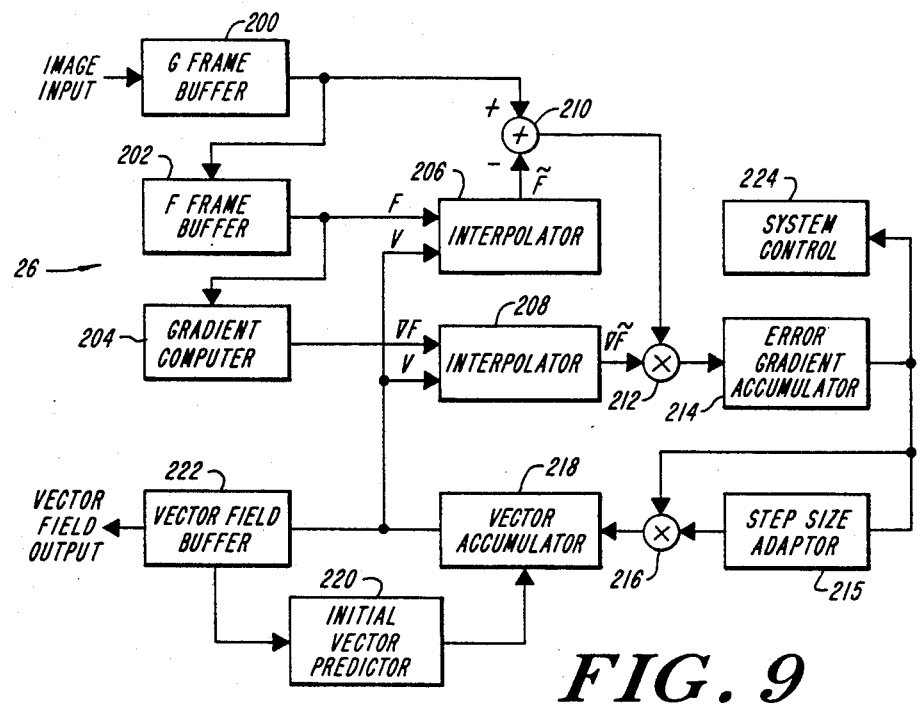
FIG. 9 is an electrical block diagram of an iterative spatial-domain motion estimation apparatus utilizing adaptive, steepest descent error minimization.

Referring now to FIG. 9, in accordance with the illustrated embodiment, the motion estimation circuitry 26 employs an iterative spatial domain approach which quickly converges through an error minimization process for determining the displacement vectors of an input signal. In the preferred embodiment, an adaptive, steepest descent approach method is employed. The method has good convergence behavior.

In Hinman, B., "Theory and Application of Image Motion Estimation," Master's Thesis, M.I.T. (1984), equation 3.12 describes the iterations for determining a displacement vector v for a pixel having a location p in an image f. The new image is represented by g. That equation is reproduced herein as Equation 1 where the "i" represents an earlier value of the displacement vector and "i+1" represents a next value of the displacement vector.

$$V^{i+1} = V^i - 2e \sum_p [g(p) - f(p - v^i)] \nabla(\cdot) f(p - v^i) \quad \text{(Equation 1)}$$

Equation 1 can be implemented in accordance with FIG. 9 where the input g and f frames are stored in buffers 200 and 202 respectively. The gradient value of the frame is determined by a gradient computer 204 and spatial interpolators 206, 208 provide the values of $\bar{f}$ required by the summation in Equation 1. A summing element 210 and a multiplication element 212 yield the error gradient value which is accumulated in an accumulator 214. The output of the accumulator 214 is multiplied by a step size adaptor 215 at a multiplier 216; and the result is used to update the vector displacement value in an accumulator 218. The accumulator receives the initial vector prediction value from a prediction hardware 220.

The updated vectors are employed by interpolators 206 and 208 in determining the values of "f" and the vector output field is stored in a buffer 222. The entire apparatus operates under the control of a system controller 224 which monitors the value of the error gradient accumulator output and in response thereto adaptively changes the step size.

Figure 10:
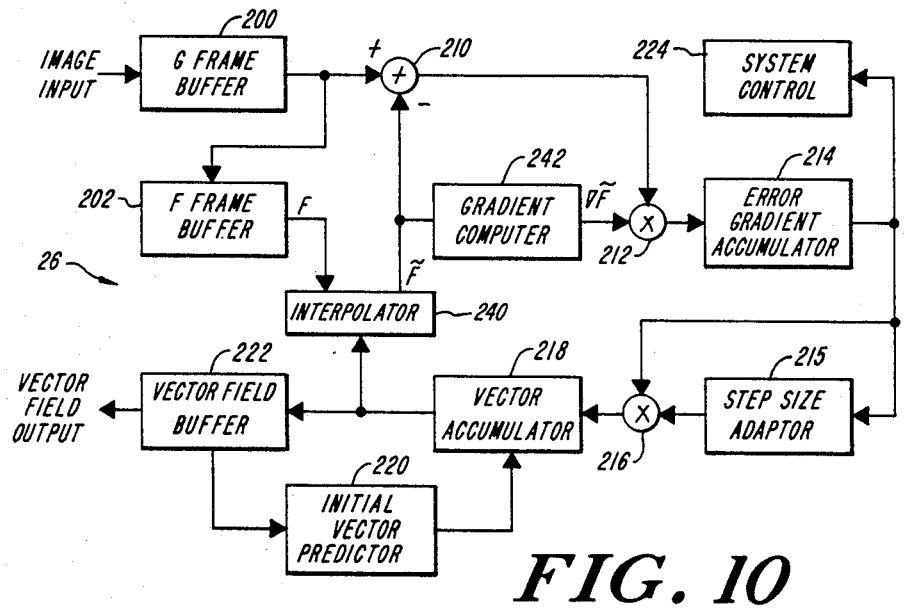
FIG. 10 is an electrical block diagram of an iterative spatial-domain motion estimation apparatus utilizing adaptive, steepest descent error minimization with an improved data processing structure.

Referring now to FIG. 10, an improved method for implementing the adaptive steepest descent error minimization iterative spatial-domain motion estimator 26, defined by equation 1, provides for use of a single interpolator 240 operating upon the f frame and a gradient computation circuitry then operating upon the interpolated value output of interpolator 240. There results from this circuitry the elimination of one of the FIG. 9 interpolators thus providing a savings of hardware and/or software.

In employing this method, the three important parameters are the initial step size, e, the stopping or cutoff threshold, T, and the predictor set, $a_k$. The initial step size plays an important role in determining the rate at which the method converges upon the motion vector displacement. When e is chosen to have a very small value, the method requires an excessive number of iterations before reaching a sufficiently small neighborhood of the minimum. As the value of e increases, the rate of convergence also increases but there comes a value when e is so large that the search procedure will oscillate about the minimum without converging. The value of e must be determined by empirical tests. For a block size of 4×4, a value of $3 \times 10^{-5}$ has been found to provide the best convergence behavior.

The cut-off threshold is compared to the magnitude of the error gradient times the initial step size, e, for each iteration. This threshold must be chosen with two constraints in mind. First, it should be sufficiently small so that a displacement close to the actual displacement is reached. The second and opposing constraint is that as the threshold decreases, the number of required iterations increases dramatically. Thus, as with the step size, the appropriate cut-off threshold must be found empirically. (When the step size varies, as described below, the threshold, I, as defined above continues to be compared against the multiplicative product of the initial step size, e, and the error gradient.)

In determining the cutoff threshold empirically, two indicators are of interest. They are the average number of iterations per block and the motion compensated frame difference energy. In order to find the best value of T, the estimation and compensation process is run several times. Starting with a small cut-off threshold, a minimal value of the motion compensated frame difference energy is determined. As the threshold is increased, the average number of iterations steadily drops while the motion compensated frame difference energy remains essentially constant. Eventually, however, a value of the threshold is reached at which the estimated displacements become inaccurate and the motion compensated frame difference energy begins to rise. In seeking the point of inflection in the motion compensated frame difference energy as a function of T, a value of $7 \times 10^{-3}$ was found to be most appropriate. This threshold corresponds to a minimum vector update of $7 \times 10^{-3}$ pixels.

The selection of the predictor coefficients affects both the average number of iterations and the motion compensation frame difference energy.

The selection of the initial value of the displacement vector for each block is, in the illustrated embodiment, chosen as a linear combination of displacement vectors adjacent thereto. Thus, referring to FIG. 11, the steepest descent method provides access to the displacement vectors above and to the left of a present displacement vector $V_o$. Thus, in accordance with the illustrated embodiment, the present displacement vector is defined by equation 2 as:

$$V_o = \sum_{j=1}^{4} a_j V_j \quad \text{(Equation 2)}$$

The $a_j$ are the predictor coefficients while the $V_j$ are the previously determined displacement vectors.

The preferred vector predictors, $a_j$, are $a_1 = 0.3$, $a_2 = 0$; $a_3 = 0.4$ and $a_4 = 0.3$. For these values of the vector predictors, in combination with the step value and threshold values noted above, for one set of data, the average number of iterations was 6.71, and the motion compensation frame difference energy was 14.1 dB's lower than the non-motion compensated frame difference energy.

In accordance with a preferred embodiment of the invention, the selected value of e, the initial step size can be adapted to change as a function of the error gradient. Thus, according to this illustrated embodiment of the invention, and under the control of the system controller 224, the step size value is adapted to change, depending upon the present gradient error value, or the present and one or more previous error gradient values, so that the step size for the vector displacement does not become unreasonably small. A description of two methods for selecting step size is provided in the Hinman thesis beginning at page 33.

According to the preferred embodiment of the invention, the second method, defined by Equations 3.18, 3.19, and 3.20 of the Hinman thesis is modified to reduce the processing load of the system. In this embodiment, the equations 3.18, 3.19, and 3.20 are modified so that:

(new step size) = (old step size) · $\alpha$     (Equation 3)

where $$\alpha = \begin{cases} 1.4 \text{ if } R > 0 \\ 0.3 \text{ if } R < 0 \end{cases}$$     (Equation 4)

and $R = $ [Gradient $E(V_x^i)$] · [Sign [Gradient $E(V_x^{i-1})$]] +

[Gradient $E(V_y^i)$] · [Sign [Gradient $E(V_y^{i-1})$]]

and "Gradient E" represents the gradient of the present x or y error function, and "Sign [·]" equals ±1 depending upon the sign of the argument. Equation 4, thus defined, provides a third method for an adaptive steepest descent approach As noted above, however, the cutoff threshold value, T, is measured against the initial step size. Thus, the illustrated T can be defined as the product of a constant times the error gradient.

Further, in accordance with the preferred embodiment of the invention, the system controller 224 also prevents the displacement increment step size from being greater than a selected threshold, for example, greater than one pixel, and further prevents the maximum value of the displacement vector from being greater than a second selected threshold, for example greater than 7½ pixels. In this manner, more control of the steepest descent process is available and singularities which prevent convergence can be avoided.

The illustrated motion estimator can be implemented in hardware, in software, or in a combination thereof. In one particular embodiment, attached hereto as Appendix C, a software implementation of an adaptive steepest descent method and apparatus is provided.

ADAPTIVE FILTER (49)

As noted above, the output of the motion compensator 42 represents the receiver motion compensated image as a result of applying the coded motion signal representation from the lossy compressor 28 to the previous frame which is stored in frame buffer 44. The receiver motion compensated image, under certain circumstances, can be improved in various spatial regions (blocks) by selectively applying a spatial low-pass filter. To decide whether the filtering process should be performed on a block of the receiver motion compensated image, a comparison of the squared prediction error between the original image and the unfiltered and filtered prediction is performed on a block-by-block basis.

A block, in this illustrated embodiment, is designated as an 8×8 grouping of picture elements. For each block, the prediction having the least error energy (weighted, for example, by a constant to provide a bias in favor of unfiltered prediction) is selected, and that decision information, the filter data available over line 63, is made available to the encoder 18. The filter data is sent to the receiver to enable it to perform the same operation as the transmitter on each corresponding block during the receiver image reconstruction process After the adaptive low-pass filtering decision has been made for a block, the resulting block image, whether or not filtered, is subtracted as noted above from the new uncoded image to generate an error image over lines 50.

The adaptive filter has four stages of operation. First, the block is low-pass filtered. Second, an energy measurement is made for both the filtered and unfiltered versions of the block in comparison to the original image. Third, a decision is made to determine if the low-pass filtered block should be inserted in place of the unfiltered receiver motion compensated image. Finally, the information describing the filter usage for each block is encoded (the filter data on lines 63) and sent to the encoder 18.

The filtering operation is performed, in accordance with the present invention, over composite blocks of the receiver motion compensated image having a size of sixteen picture elements by sixteen picture elements. The low-pass filter, in accordance with the illustrated embodiment of the invention, provides for a simple 5×5 block averaging. The averaging process is performed, in accordance with this embodiment of the invention, as a length five moving average on all of the rows followed by a length five moving average of all of the columns.

Each 16×16 composite block at an edge of the image is enlarged by adding two rows above or below and/or two columns to the right or to the left of the existing block in order to provide the data needed for the 5×5 average. The result is thus generated for each of the sixteen pixels in the row by averaging the current pixel value with the value of the two pixels to the left and the two pixels to the right. For the first pixel in each row, the averaging is done explicitly in accordance with the illustrated embodiment of the invention; however, for the remaining pixels of the row, the average can be determined by successively adding the next pixel to the right and subtracting the next pixel to the left of the length five region. The resulting values are stored in a separate 16×16 array. After filtering of all rows, the same averaging procedure is performed on all of the sixteen columns and the results are stored in a separate 16×16 array. For those composite blocks at the edge of a frame, the two extra rows or columns are obtained by repeating the row or column at the edge of the composite block.

Once the filtered version of the reference block has been generated, the error energy is determined for both the predicted receiver motion compensated block and the filtered motion compensated block. The energies are determined for each of the 8×8 blocks in the overall 16×16 composite block. The energy values, in accordance with the illustrated embodiment of the invention, are determined by a sum of squares operation for every picture element of the block. The comparison is made to the original image which is available to the adaptive filter from the analog-to-digital conversion and frame buffer 12, over lines 22.

The two energy measurements that result for each of the 8×8 blocks are compared to determine whether the filtered block should be used as a replacement for the unfiltered block in the motion compensated frame. The energies are compared to each other using a constant weighting multiplier. After the weighting, the block having the smaller energy value is selected. If the unfiltered error energy is lower, the 8×8 block from the motion compensator 42 remains unchanged and is directed to the leak multiplication circuitry and thence to adder 60. If the filter error energy is lower, then the original 8×8 block is replaced by the corresponding 8×8 filtered block from the adaptive filtering process.

For each 16×16 composite block, the result of the comparisons are stored in a list and a four bit code is generated which indicates which of the four blocks is to be filtered and which is not.

In accordance with the preferred embodiment of the invention, the four bit codes that describe the filter data for each 16×16 composite block are coded using a variable length code. The variable length coding procedure takes advantage of the fact that filtered blocks tend to appear in clusters.

At the receiver, the variable length filter data is decoded and the data, referring to FIG. 3, is directed to the motion compensator 99. In this embodiment, the motion compensator includes circuitry for determining when filtering is to be applied to its input data. If filtering is employed, indicated by a nonzero decoded code word, then the 16×16 composite block is low-pass filtered in accordance with the code word and the appropriate 8×8 blocks available at the input of the motion compensator 99 are replaced by their corresponding filtered block versions.

In accordance with the illustrated embodiment of the invention, the preferred weighting constant is equal to one. Thus, the error associated with the filtered output must be smaller than the error associated with the unfiltered output before a filtered block will be substituted for that unfiltered block.

The adaptive filter method and apparatus can be implemented in hardware, in software, or in a combination of the two. Attached hereto as Appendix A is a software implementation of the method.

Additions, subtractions, deletions, and other modifications of the preferred particular embodiments of the invention will be apparent to those skilled in the art and are within the scope of the following claims.

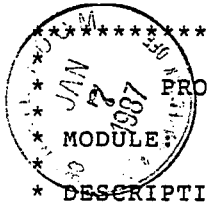

```
********************** PicTel Corporation *************************
*           PROPRIETARY AND COMPANY PRIVATE:  NOT FOR RELEASE
*  MODULE:          SUBROUTINE SWITCHED_FILTER
*
* DESCRIPTION:    SWITCHED_FILTER performs a NxN averaging in the blocks
*                 selected for update in the warped image.
*                 Filtered or non-filtered warped image is chosen based
*                 on the mean square error compared to the new image.
*                 A map describing filter usage is returned.
*
* PARAMETERS:
*    (*) Cim      BYTE (256,240) Should contain warped image when calling;
*                 returns the warped image selectively filtered.
*        Nim      BYTE (256,240) New image
*        catmap   INTEGER (16,15) Block category assignment; only blocks
*                 selected for update are processed.
*    (*) filtmap  INTEGER (16,15) Filter map; every entry is between
*                 0 and 15, where each of the 4 bits describes filter usage
*                 in an 8x8 subblock.
*
* ROUTINES REQUIRED:
*        MSE_BLK          - Compute energy of block of differences (This file
*        BMOVE            - Copy byte sub-array (This file)
*        QUADWORD         - Generate zero/non-zero indication for 4 integer
*                           values.
*
*
* AUTHOR:         Staffan Ericsson
*
* DATE CREATED: June 14, 1985
*
* MODIFIED BY:
*
                                APPENDIX A
        SUBROUTINE switched_filter (Cim, Nim, catmap, filtmap)
        IMPLICIT NONE
        INCLUDE 'IMAGESIZE.PAR/LIST'
        INCLUDE 'CATS.PAR/LIST'
        PARAMETER HSUBNUM=2, VSUBNUM=2,    ! Filter subblocks per update block
                  HSUBSZ=YHBLKSZ/HSUBNUM,  ! Filter subblock size
                  VSUBSZ=YVBLKSZ/VSUBNUM,
```

```
              MAXEXT=5                    ! Allows 11x11 filter
     BYTE Cim (YHIMSZ,YVIMSZ), Nim (YHIMSZ,YVIMSZ),
          filtblk (YHBLKSZ,YVBLKSZ)
     INTEGER catmap(HBLKNUM,VBLKNUM), filtmap(HBLKNUM,VBLKNUM),
          i,j,k, iext, Hblk,Vblk, Hind,Vind, n1,n2,
          bit(0:HSUBNUM-1,0:VSUBNUM-1),
          CLIP, QUADWORD
     REAL temp, tempvec (1-MAXEXT : YHBLKSZ+MAXEXT),
          tempmat (YHBLKSZ, 1-MAXEXT : YVBLKSZ+MAXEXT), pow1,pow2
     INCLUDE 'SWFILTPAR.CMN/LIST'
     CLIP (Hind, i,j) = MAX0 (i, MIN0(j, Hind))

iext = nfiltsize/2      ! Assume nfiltsize is odd
     IF (iext.GT.MAXEXT) STOP
          'SWITCHED_FILTER -- Too large filter'
     n1 = 0                  ! Number of unfiltered blocks
     n2 = 0                  ! Number of filtered blocks
     DO Vblk = 1,VBLKNUM
        DO Hblk = 1,HBLKNUM
           IF (catmap(Hblk,Vblk) .NE. NO_UPDATE) THEN
* Horizontal filtering
              DO i = 1-iext,YVBLKSZ+iext
                 Vind = CLIP (i + (Vblk-1)*YVBLKSZ, 1, YVIMSZ)
                 DO j = 1-iext,YHBLKSZ+iext
                    Hind = CLIP (j + (Hblk-1)*YHBLKSZ, 1, YHIMSZ)
                    tempvec(j) = Cim(Hind,Vind)
                 END DO
                 DO j = 1,YHBLKSZ
                    tempmat(j,i) = 0.
                    DO k = -iext,iext
                       tempmat(j,i) = tempmat(j,i) + tempvec(j+k)
                    END DO
                 END DO
              END DO
* Vertical filtering
              DO i = 1,YVBLKSZ
                 DO j = 1,YHBLKSZ
                    temp = 0.
                    DO k = -iext,iext
                       temp = temp + tempmat(j,i+k)
                    END DO
                    filtblk(j,i) = temp / FLOAT((2*iext+1)**2)
                 END DO
              END DO
* Compute pred.err for filter and no filter
              DO i = 1,VSUBNUM
                 Vind = 1 + (Vblk-1)*YVBLKSZ + (i-1)*VSUBSZ
                 DO j = 1,HSUBNUM
                    Hind = 1 + (Hblk-1)*YHBLKSZ + (j-1)*HSUBSZ
                    CALL mse_blk (Cim(Hind,Vind), YHIMSZ, Nim(Hind,Vind),
                                  YHIMSZ, HSUBSZ,VSUBSZ, pow1)
                    CALL mse_blk (filtblk (1+(j-1)*HSUBSZ, 1+(i-1)*VSUBSZ),
                                  YHBLKSZ, Nim(Hind,Vind), YHIMSZ,
                                  HSUBSZ, VSUBSZ, pow2)
* Choose min. pred.err
                    IF (filt_weight*pow2 .LT. pow1) THEN
                       CALL bmove (filtblk (1+(j-1)*HSUBSZ, 1+(i-1)*VSUBSZ),
                                   YHBLKSZ, Cim(Hind,Vind), YHIMSZ,
                                   HSUBSZ, VSUBSZ)
                       bit(j-1,i-1) = 1
                       n2 = n2 + 1
                    ELSE
                       bit(j-1,i-1) = 0
                       n1 = n1 + 1
                    END IF
```

```
                    END DO
                  END DO
* Form filter word
                  filtmap(Hblk,Vblk) = QUADWORD (bit(0,0), bit(1,0),
                                                 bit(0,1), bit(1,1))
                ELSE
                  filtmap(Hblk,Vblk) = 0
                END IF
              END DO
            END DO
            TYPE 100, n1, 2*iext+1,2*iext+1, n2
100         FORMAT ('  No filter used in', I5,' blocks'/
           '  ',I2,' *',I2,' average in', I5,' blocks'/)
            RETURN
            END
* mse_blk - compute energy for block of differences
      SUBROUTINE mse_blk (b1,b1dim, b2,b2dim, Xblksz,Yblksz, pow)
      IMPLICIT NONE
      INTEGER b1dim, b2dim, Xblksz, Yblksz
      BYTE b1(b1dim,*), b2(b2dim,*)
      REAL pow
      INTEGER i,j, itemp1, itemp2, isumsq isumsq = 0
      DO i = 1,Yblksz
        DO j = 1,Xblksz
          itemp1 = b1(j,i)
          itemp2 = b2(j,i)
          isumsq = isumsq + (itemp1-itemp2)**2
        END DO
      END DO
      pow = FLOAT(isumsq) / FLOAT(Xblksz*Yblksz)

RETURN
      END
* bmove - move byte sub-array of size Xblksz*Yblksz
      SUBROUTINE bmove (b1, b1dim, b2,b2dim, Xblksz,Yblksz)
      IMPLICIT NONE
      INTEGER b1dim, b2dim, Xblksz,Yblksz, i,j
      BYTE b1(b1dim,*), b2(b2dim,*)

DO i = 1,Yblksz
        DO j = 1,Xblksz
          b2(j,i) = b1(j,i)
        END DO
      END DO
      RETURN
      END
C*******************************************************************
C
C       LWARP2.FOR       PicTel Corporation       February 9, 1985
C
C       PROPRIETARY AND COMPANY PRIVATE:   NOT FOR RELEASE
C
C*******************************************************************
C
C       Last updated on February 21, 1985
C
C       Brian L. Hinman
C
C       Warps the reconstructed luminance image
C       according to the coded vector field.
C
C       Argument are:
C              cXmo   -    (input) the coded X motion vectors.
C              cYmo   -    (input) the coded Y motion vectors.
```

```
c           Rlim    -   (input) the reconstructed luminance image to be
c                           warped by cXmo and cYmo.
c           WRlim   -   (output) the warped version of Rlim.
c           mwid    -   (input) the number of vectors horizontally.
c           mhei    -   (input) the number of vectors vertically.
c           w       -   (input) the vector interpolation function
c           mult    -   (input) multiplier on vector field
c
       Subroutine lwarp2 (cXmo, cYmo, Rlim, WRlim, mwid, mhei,
     *                    w2, mult)
c
c      The greatest debug tool since Pascal
c
       IMPLICIT NONE
c
c      Debug print level.  Not especially useful
c
       COMMON /debug/ prtlvl INTEGER mwid, mhei
       REAL cXmo (0:mwid+1, 0:mhei+1), cYmo (0:mwid+1, 0:mhei+1)
       BYTE Rlim (-15:272, -15:256), WRlim (-15:272, -15:256)
       REAL w2 (256/mwid, 240/mhei), mult
       REAL Xrelative, Yrelative, vx, vy, fracX, fracY
       INTEGER prtlvl
       INTEGER Xblock, Yblock, X, Y, X1, X2, Y1, Y2
       INTEGER Xres, Yres, sizX, sizY, Xtop, Ytop
       INTEGER vxint, vyint, Xmoved, Ymoved
c
c      sizX and sizY are the block size
c      Xtop and Ytop are used as limit+1 for the
c         'w' interpolation function.
c
       IF (prtlvl .GE. 1) TYPE *,'lwarp'
       sizX = 256/mwid
       sizY = 240/mhei
       Xtop = sizX + 1
       Ytop = sizY + 1
c
c      X and Y step through the luminance image
```

APPENDIX B

```
       DO 100 Y = 1, 240
c
c      Yblock is the Y warping region with respect to the
c         decimated 32x30 motion vector field.
c      Yrelative is the absolute location of the start of
c         the present warping region.
c      Yres is the residual offset within the present region
c
           Yblock = (Y + 0.5 * (sizY-1)) / sizY
           Yrelative = (Yblock-1) * sizY + sizY/2
           Yres = Y - Yrelative DO 100 X = 1, 256
c
c      Xblock is the X warping region with respect to the
c         decimated 32x30 motion vector field.
c      Xrelative is the absolute location of the start of
c         the present warping region.
c      Xres is the residual offset within the present region.
c
```

```
      IF (prtlvl .GE. 2) TYPE *,'lwarp pixel (x,y)',x,y
      Xblock = (X + 0.5 * (sizX-1)) / sizX
      Xrelative = (Xblock-1) * sizX + sizX/2
      Xres = X - Xrelative
c
c   Interpolate the vector field
c   w(x, y) is a 'raised cosine' function originally
c     created in the wcreate subroutine.
c   vx and vy are the components of the interpolated vector
c
      vx = w2(Xres,Yres)*cXmo(Xblock,Yblock) +
   *       w2(Xtop-Xres,Yres)*cXmo(Xblock+1,Yblock) +
   *       w2(Xres,Ytop-Yres)*cXmo(Xblock,Yblock+1) +
   *       w2(Xtop-Xres,Ytop-Yres)*cXmo(Xblock+1,Yblock+1)

vy = w2(Xres,Yres)*cYmo(Xblock,Yblock) +
   *       w2(Xtop-Xres,Yres)*cYmo(Xblock+1,Yblock) +
   *       w2(Xres,Ytop-Yres)*cYmo(Xblock,Yblock+1) +
   *       w2(Xtop-Xres,Ytop-Yres)*cYmo(Xblock+1,Yblock+1)
c
c   Scale the vector by 2 since it is for luma and
c   also scale by the multiplier in case we wish to
c   interpolate a frame.
c
      vx = vx * mult * 2.
      vy = vy * mult * 2.
c
c   vxint and vyint are the integerized versions of vx and vy
c   This +100 , -100 business is to make the integerize
c   property work correctly for negative numbers.  Yes, folks,
c   there is a rounding function (JNINT) in FORTRAN that could be
c   used by subtracting 0.5, but this requires a subroutine call
c   and is therefore much less efficient.  So there.
c
      vxint = vx + 100
      vyint = vy + 100
      vxint = vxint - 100
      vyint = vyint - 100
c
c   fracY and fracX are the fractional pixel offsets
c
      fracY = vy - vyint
      fracX = vx - vxint
c
c   Xmoved and Ymoved are the integerized coordinates of
c     the moved pixel location on the 256x240 luma image.
c
      Xmoved = X + vxint
      Ymoved = Y + vyint
c
c   Warp the luminance image
c   Notice that NINT is used.  This prevents a systematic
c     offset of -1/2 LSB from being introduced.
c
      WRlim(X, Y) = NINT(
   *              (1-fracX)*(1-fracY)*Rlim(Xmoved,Ymoved)
   *            + fracX*(1-fracY)*Rlim(Xmoved+1,Ymoved)
   *            + (1-fracX)*fracY*Rlim(Xmoved,Ymoved+1)
   *            + fracX*fracY*Rlim(Xmoved+1,Ymoved+1))

100   CONTINUE

RETURN
      END
```

```
C*********************************************************************
C
C       CWARP.FOR       PicTel Corporation      January 17, 1985
C
C       PROPRIETARY AND COMPANY PRIVATE:  NOT FOR RELEASE
C
C*********************************************************************
C
C       Last updated on February 21, 1985
C
C       Brian L. Hinman
C
C       Warps the reconstructed chrominance images
C       according to the coded vector field.
C
C       This subroutine calls the subroutines:
C            vinterp
C            pelinterp
C
C       Argument are:
C            cXmo    -  (input) the coded X motion vectors.
C            cYmo    -  (input) the coded Y motion vectors.
C            Rqim    -  (input) the reconstructed 'Q' chroma image to be
C                               warped by cXmo and cYmo.
C            Riim    -  (input) the reconstructed 'I' chroma image to be
C                               warped by cXmo and cYmo.
C            WRqim   -  (output) the warped version of Rqim.
C            WRiim   -  (output) the warped version of Riim.
C            mwid    -  (input) the number of vectors horizontally.
C            mhei    -  (input) the number of vectors vertically.
C            w       -  (input) the vector interpolation function
C            mult    -  (input) multiplier on the vector field
C
        Subroutine cwarp (cXmo, cYmo, Rqim, Riim, WRqim,
     *                   WRiim, mwid, mhei, w, mult)

IMPLICIT NONE

COMMON /debug/ prtlvl

INTEGER mhei, mwid
        REAL cXmo (0:mwid+1, 0:mhei+1), cYmo (0:mwid+1, 0:mhei+1)
        BYTE Rqim (-7:136, -7:128), WRqim (-7:136, -7:128)
        BYTE Riim (-7:136, -7:128), WRiim (-7:136, -7:128)
        REAL w (128/mwid, 120/mhei), mult, vy, vx, fracX, fracY
        REAL Xrelative, Yrelative
        INTEGER vxint, vyint, Xmoved, Ymoved, prtlvl
        INTEGER Xblock, Yblock, X, Y, Xtop, Ytop
        INTEGER Xres, Yres, sizX, sizY
C
C       Figure out the block size
C
        sizX = 128/mwid
        sizY = 120/mhei
        Xtop = sizX + 1
        Ytop = sizY + 1

IF (prtlvl.GE.1) TYPE *, 'cwarp'
```

APPENDIX C

```
        DO 100 Y = 1, 120

Yblock = (Y + 0.5 * (sizY-1)) / sizY
            Yrelative = (Yblock-1) * sizY + 2
```

```
          Yres = Y - Yrelative

DO 100 X = 1, 128

IF (prtlvl.GE.2) TYPE *,'cwarp pixel (x,y):', x, y
             Xblock = (X + 0.5 * (sizX-1)) / sizX
             Xrelative = (Xblock-1) * sizX + 2
             Xres = X - Xrelative
c
c     Interpolate the vector field
c
             vx = w(Xres,Yres)*cXmo(Xblock,Yblock) +
     *            w(Xtop-Xres,Yres)*cXmo(Xblock+1,Yblock) +
     *            w(Xres,Ytop-Yres)*cXmo(Xblock,Yblock+1) +
     *            w(Xtop-Xres,Ytop-Yres)*cXmo(Xblock+1,Yblock+1)

vy = w(Xres,Yres)*cYmo(Xblock,Yblock) +
     *            w(Xtop-Xres,Yres)*cYmo(Xblock+1,Yblock) +
     *            w(Xres,Ytop-Yres)*cYmo(Xblock,Yblock+1) +
     *            w(Xtop-Xres,Ytop-Yres)*cYmo(Xblock+1,Yblock+1)
c
c     Scale the vector by the multiplier in case we
c     want an interpolated frame
c
             vx = vx * mult
             vy = vy * mult
c
c     Perform the pel 'warp' on the I and Q components
c
c     vxint and vyint are the integerized versions of vx and vy
c     This +100 , -100 business is to make the integerize
c     property work correctly for negative numbers. Yes, folks,
c     there is a rounding function (JNINT) in FORTRAN that could be
c     used by subtracting 0.5, but this requires a subroutine call
c     and is therefore much less efficient. So there.
c
             vxint = vx + 100
             vyint = vy + 100
             vxint = vxint - 100
             vyint = vyint - 100
c
c     fracY and fracX are the fractional pixel offsets
c
             fracY = vy - vyint
             fracX = vx - vxint Xmoved = X + vxint
             Ymoved = Y + vyint WRqim (X, Y) = NINT((1-fracX)*(1-fracY)*Rqim(Xmoved,Ymoved)
     *                    + fracX*(1-fracY)*Rqim(Xmoved+1,Ymoved)
     *                    + (1-fracX)*fracY*Rqim(Xmoved,Ymoved+1)
     *                    + fracX*fracY*Rqim(Xmoved+1,Ymoved+1))

WRiim (X, Y) = NINT((1-fracX)*(1-fracY)*Riim(Xmoved,Ymoved)
     *                    + fracX*(1-fracY)*Riim(Xmoved+1,Ymoved)
     *                    + (1-fracX)*fracY*Riim(Xmoved,Ymoved+1)
     *                    + fracX*fracY*Riim(Xmoved+1,Ymoved+1))

100       CONTINUE

RETURN
          END
```

```
************************ PicTel Corporation ************************
*
*       PROPRIETARY AND COMPANY PRIVATE:   NOT FOR RELEASE
*
* MODULE:           SUBROUTINE DECIDE_STATE
*
* DESCRIPTION:  Choose quantization state based on coded blocks
*               in previous image, category map for new image,
*               mean square prediction error in previous and new image,
*               and quant. state in previous image.
*
* PARAMETERS:
*   (*) qstate            INTEGER; Contains quant. state used for previous
*                         frame when entering routine. Returns new value.
*       codedblocks       INTEGER; Number of coded blocks in prev. frame.
*       map               INTEGER (16,15); Block category assignment map.
*       tot_err           REAL; Mean square prediction error for new image
*       tot_err_prev      REAL; Mean square prediction error for previous ima
*       mode              INTEGER; Image mode for new frame
*   (*) goalblocks        INTEGER; Returns goal for number of coded blocks
*                         in new image
*
* ROUTINES REQUIRED:    None
*
* AUTHOR:       Staffan Ericsson
*
* DATE CREATED: June 16, 1985
*
* MODIFIED BY:
*     S. Ericsson   July 9, 1985:  Returning "goalblocks".
*     S Ericsson    Aug. 23, 1985: Using mean square error instead of
*            RMS, i.e., changing constant BETA to half the old value.
*     S Ericsson    Aug. 26, 1985: Routine returns "qstate" instead
*            of real-valued "qparam".
*     S Ericsson    July 23, 1986: Changed constants N_STATES,
*            QSTATE_ENTER_NORMAL, and QSTATE_LOWRES.
*
      SUBROUTINE decide_state (qstate, codedblocks, map, tot_err,
     -                        tot_err_prev, mode, goalblocks)
        IMPLICIT NONE
        INCLUDE 'IMAGESIZE.PAR/LIST'
        INCLUDE 'CATS.PAR/LIST'
        INCLUDE 'MODES.PAR/LIST'
        INTEGER qstate, map(HBLKNUM,VBLKNUM), codedblocks, mode,
     -          goalblocks, Hblk, Vblk, imap, previous_mode
        REAL tot_err, tot_err_prev
        LOGICAL first_call /.TRUE./
        SAVE first_call, previous_mode
        INCLUDE 'HIMODE.CMN/LIST'
        PARAMETER BETA=6., GAMMA=6., N_STATES=48
        PARAMETER MARGIN = 15
        PARAMETER QSTATE_LOWRES=42, QSTATE_ENTER_NORMAL=N_STATES-1 goalblocks = 0
        IF (first_call) THEN      ! Don't change qstate at first call
          first_call = .FALSE.
        ELSE IF (mode .NE. NORMAL_MODE) THEN     ! Overload or build-up mode
          qstate = QSTATE_LOWRES
        ELSE IF (previous_mode .NE. NORMAL_MODE) THEN
          qstate = QSTATE_ENTER_NORMAL
        ELSE                            ! Normal mode in new and previous frame
* Compute blocks in cat. 1 and 2 (goal for number of coded blocks)
          DO Hblk = 1,HBLKNUM
            DO Vblk = 1,VBLKNUM
              imap = map(Hblk,Vblk)
```

```
            IF (imap.EQ.CAT_MOVING .OR. imap.EQ.CAT_ENERGY)
                goalblocks=goalblocks+1
          END DO
        END DO
        goalblocks = MIN0 (goalblocks, n1234-MARGIN)
* Account for change in energy
* Compare present goal with coded blocks in previous frame
        qstate = qstate + NINT (BETA * (tot_err/AMAX1(1.,tot_err_prev)-1.
    _       GAMMA * (FLOAT(goalblocks)/FLOAT(MAX0(20,codedblocks))-1.))
* Decrease state if we ran out of blocks
        IF (codedblocks .EQ. n1234) THEN        ! Ran out of blocks
          qstate = qstate - 1
        END IF
* Limit result to allowed range
        IF (qstate .LT. 0) qstate = 0
        IF (qstate .GE. N_STATES) qstate = N_STATES-1
      END IF
      previous_mode = mode

RETURN
      END
```

APPENDIX E

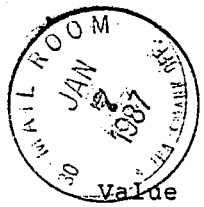

CODEWORD TABLE 1  8x8 QUADWORDS
================================

| Value | Codeword length | Codeword |
|---|---|---|
| 0 | 1 | 0 |
| 1 | 7 | 1110110 |
| 2 | 7 | 1110111 |
| 3 | 7 | 1111000 |
| 4 | 7 | 1111001 |
| 5 | 7 | 1111010 |
| 6 | 7 | 1111011 |
| 7 | 7 | 1111100 |
| 8 | 2 | 10 |
| 9 | 7 | 1111101 |
| 10 | 3 | 110 |
| 11 | 7 | 1111110 |
| 12 | 6 | 111000 |
| 13 | 7 | 1111111 |
| 14 | 6 | 111001 |
| 15 | 6 | 111010 |
| 0 | – | – |
| 1 | 6 | 110110 |
| 2 | 6 | 110111 |
| 3 | 6 | 111000 |
| 4 | 6 | 111001 |
| 5 | 6 | 111010 |
| 6 | 6 | 111011 |
| 7 | 6 | 111100 |
| 8 | 1 | 0 |
| 9 | 6 | 111101 |
| 10 | 2 | 10 |
| 11 | 6 | 111110 |
| 12 | 5 | 11000 |
| 13 | 6 | 111111 |
| 14 | 5 | 11001 |
| 15 | 5 | 11010 |

CODEWORD TABLE 3  2x2 QUADWORDS
=================================

| Value | Codeword length | Codeword |
|-------|-----------------|----------|
| 0     | –               | –        |
| 1     | 5               | 11000    |
| 2     | 3               | 010      |
| 3     | 6               | 111100   |
| 4     | 3               | 011      |
| 5     | 6               | 111101   |
| 6     | 6               | 111110   |
| 7     | 6               | 111111   |
| 8     | 2               | 00       |
| 9     | 5               | 11001    |
| 10    | 3               | 100      |
| 11    | 5               | 11010    |
| 12    | 3               | 101      |
| 13    | 5               | 11011    |
| 14    | 5               | 11100    |
| 15    | 5               | 11101    |

CODEWORD TABLE 4  AMPLITUDE WORDS
=================================

| Value | Codeword length | Codeword |
|-------|-----------------|----------|
| -128  | 15 | 111111101111110 |
| -127  | 15 | 111111101111111 |
| -126  | 15 | 111111110000000 |
| -125  | 15 | 111111110000001 |
| -124  | 15 | 111111110000010 |
| -123  | 15 | 111111110000011 |
| -122  | 15 | 111111110000100 |
| -121  | 15 | 111111110000101 |
| -120  | 15 | 111111110000110 |
| -119  | 15 | 111111110000111 |
| -118  | 15 | 111111110001000 |
| -117  | 15 | 111111110001001 |
| -116  | 15 | 111111110001010 |
| -115  | 15 | 111111110001011 |
| -114  | 15 | 111111110001100 |
| -113  | 15 | 111111110001101 |
| -112  | 15 | 111111110001110 |
| -111  | 15 | 111111110001111 |
| -110  | 15 | 111111110010000 |
| -109  | 15 | 111111110010001 |
| -108  | 15 | 111111110010010 |
| -107  | 15 | 111111110010011 |
| -106  | 15 | 111111110010100 |
| -105  | 15 | 111111110010101 |
| -104  | 15 | 111111110010110 |
| -103  | 15 | 111111110010111 |
| -102  | 15 | 111111110011000 |
| -101  | 15 | 111111110011001 |
| -100  | 15 | 111111110011010 |
| -99   | 15 | 111111110011011 |
| -98   | 15 | 111111110011100 |
| -97   | 15 | 111111110011101 |
| -96   | 15 | 111111110011110 |
| -95   | 15 | 111111110011111 |
| -94   | 15 | 111111110100000 |
| -93   | 15 | 111111110100001 |

| | | |
|---|---|---|
| -92 | 15 | 111111110100010 |
| -91 | 15 | 111111110100011 |
| -90 | 15 | 111111110100100 |
| -89 | 15 | 111111110100101 |
| -88 | 15 | 111111110100110 |
| -87 | 15 | 111111110100111 |
| -86 | 15 | 111111110101000 |
| -85 | 15 | 111111110101001 |
| -84 | 15 | 111111110101010 |
| -83 | 15 | 111111110101011 |
| -82 | 15 | 111111110101100 |
| -81 | 15 | 111111110101101 |
| -80 | 15 | 111111110101110 |
| -79 | 15 | 111111110101111 |
| -78 | 15 | 111111110110000 |
| -77 | 15 | 111111110110001 |
| -76 | 15 | 111111110110010 |
| -75 | 15 | 111111110110011 |
| -74 | 15 | 111111110110100 |
| -73 | 15 | 111111110110101 |
| -72 | 15 | 111111110110110 |
| -71 | 15 | 111111110110111 |
| -70 | 15 | 111111110111000 |
| -69 | 15 | 111111110111001 |
| -68 | 15 | 111111110111010 |
| -67 | 15 | 111111110111011 |
| -66 | 15 | 111111110111100 |
| -65 | 15 | 111111110111101 |
| -64 | 15 | 111111110111110 |
| -63 | 15 | 111111110111111 |
| -62 | 14 | 11111110000000 |
| -61 | 14 | 11111110000001 |
| -60 | 14 | 11111110000010 |
| -59 | 14 | 11111110000011 |
| -58 | 14 | 11111110000100 |
| -57 | 14 | 11111110000101 |
| -56 | 14 | 11111110000110 |
| -55 | 14 | 11111110000111 |
| -54 | 14 | 11111110001000 |
| -53 | 14 | 11111110001001 |
| -52 | 14 | 11111110001010 |
| -51 | 14 | 11111110001011 |
| -50 | 14 | 11111110001100 |
| -49 | 14 | 11111110001101 |
| -48 | 14 | 11111110001110 |
| -47 | 14 | 11111110001111 |
| -46 | 14 | 11111110010000 |
| -45 | 14 | 11111110010001 |
| -44 | 14 | 11111110010010 |
| -43 | 14 | 11111110010011 |
| -42 | 14 | 11111110010100 |
| -41 | 14 | 11111110010101 |
| -40 | 14 | 11111110010110 |
| -39 | 14 | 11111110010111 |
| -38 | 14 | 11111110011000 |
| -37 | 14 | 11111110011001 |
| -36 | 14 | 11111110011010 |
| -35 | 14 | 11111110011011 |
| -34 | 14 | 11111110011100 |
| -33 | 14 | 11111110011101 |
| -32 | 14 | 11111110011110 |
| -31 | 12 | 111111000000 |
| -30 | 12 | 111111000001 |
| -29 | 12 | 111111000010 |
| -28 | 12 | 111111000011 |

| | | |
|---|---|---|
| −27 | 12 | 111111000100 |
| −26 | 12 | 111111000101 |
| −25 | 12 | 111111000110 |
| −24 | 12 | 111111000111 |
| −23 | 12 | 111111001000 |
| −22 | 12 | 111111001001 |
| −21 | 12 | 111111001010 |
| −20 | 12 | 111111001011 |
| −19 | 12 | 111111001100 |
| −18 | 12 | 111111001101 |
| −17 | 12 | 111111001110 |
| −16 | 12 | 111111001111 |
| −15 | 10 | 1111100000 |
| −14 | 10 | 1111100001 |
| −13 | 10 | 1111100010 |
| −12 | 10 | 1111100011 |
| −11 | 10 | 1111100100 |
| −10 | 10 | 1111100101 |
| −9 | 10 | 1111100110 |
| −8 | 10 | 1111100111 |
| −7 | 7 | 1111000 |
| −6 | 7 | 1111001 |
| −5 | 5 | 11100 |
| −4 | 4 | 1100 |
| −3 | 3 | 100 |
| −2 | 2 | 00 |
| −1 | − | − |
| 0 | − | − |
| 1 | − | − |
| 2 | 2 | 01 |
| 3 | 3 | 101 |
| 4 | 4 | 1101 |
| 5 | 5 | 11101 |
| 6 | 7 | 1111010 |
| 7 | 7 | 1111011 |
| 8 | 10 | 1111101000 |
| 9 | 10 | 1111101001 |
| 10 | 10 | 1111101010 |
| 11 | 10 | 1111101011 |
| 12 | 10 | 1111101100 |
| 13 | 10 | 1111101101 |
| 14 | 10 | 1111101110 |
| 15 | 10 | 1111101111 |
| 16 | 12 | 111111010000 |
| 17 | 12 | 111111010001 |
| 18 | 12 | 111111010010 |
| 19 | 12 | 111111010011 |
| 20 | 12 | 111111010100 |
| 21 | 12 | 111111010101 |
| 22 | 12 | 111111010110 |
| 23 | 12 | 111111010111 |
| 24 | 12 | 111111011000 |
| 25 | 12 | 111111011001 |
| 26 | 12 | 111111011010 |
| 27 | 12 | 111111011011 |
| 28 | 12 | 111111011100 |
| 29 | 12 | 111111011101 |
| 30 | 12 | 111111011110 |
| 31 | 12 | 111111011111 |
| 32 | 14 | 11111110011111 |
| 33 | 14 | 11111110100000 |
| 34 | 14 | 11111110100001 |
| 35 | 14 | 11111110100010 |
| 36 | 14 | 11111110100011 |
| 37 | 14 | 11111110100100 |
| 38 | 14 | 11111110100101 |

| | | |
|---|---|---|
| 39 | 14 | 11111110100110 |
| 40 | 14 | 11111110100111 |
| 41 | 14 | 11111110101000 |
| 42 | 14 | 11111110101001 |
| 43 | 14 | 11111110101010 |
| 44 | 14 | 11111110101011 |
| 45 | 14 | 11111110101100 |
| 46 | 14 | 11111110101101 |
| 47 | 14 | 11111110101110 |
| 48 | 14 | 11111110101111 |
| 49 | 14 | 11111110110000 |
| 50 | 14 | 11111110110001 |
| 51 | 14 | 11111110110010 |
| 52 | 14 | 11111110110011 |
| 53 | 14 | 11111110110100 |
| 54 | 14 | 11111110110101 |
| 55 | 14 | 11111110110110 |
| 56 | 14 | 11111110110111 |
| 57 | 14 | 11111110111000 |
| 58 | 14 | 11111110111001 |
| 59 | 14 | 11111110111010 |
| 60 | 14 | 11111110111011 |
| 61 | 14 | 11111110111100 |
| 62 | 14 | 11111110111101 |
| 63 | 14 | 11111110111110 |
| 64 | 15 | 111111111000000 |
| 65 | 15 | 111111111000001 |
| 66 | 15 | 111111111000010 |
| 67 | 15 | 111111111000011 |
| 68 | 15 | 111111111000100 |
| 69 | 15 | 111111111000101 |
| 70 | 15 | 111111111000110 |
| 71 | 15 | 111111111000111 |
| 72 | 15 | 111111111001000 |
| 73 | 15 | 111111111001001 |
| 74 | 15 | 111111111001010 |
| 75 | 15 | 111111111001011 |
| 76 | 15 | 111111111001100 |
| 77 | 15 | 111111111001101 |
| 78 | 15 | 111111111001110 |
| 79 | 15 | 111111111001111 |
| 80 | 15 | 111111111010000 |
| 81 | 15 | 111111111010001 |
| 82 | 15 | 111111111010010 |
| 83 | 15 | 111111111010011 |
| 84 | 15 | 111111111010100 |
| 85 | 15 | 111111111010101 |
| 86 | 15 | 111111111010110 |
| 87 | 15 | 111111111010111 |
| 88 | 15 | 111111111011000 |
| 89 | 15 | 111111111011001 |
| 90 | 15 | 111111111011010 |
| 91 | 15 | 111111111011011 |
| 92 | 15 | 111111111011100 |
| 93 | 15 | 111111111011101 |
| 94 | 15 | 111111111011110 |
| 95 | 15 | 111111111011111 |
| 96 | 15 | 111111111100000 |
| 97 | 15 | 111111111100001 |
| 98 | 15 | 111111111100010 |
| 99 | 15 | 111111111100011 |
| 100 | 15 | 111111111100100 |
| 101 | 15 | 111111111100101 |
| 102 | 15 | 111111111100110 |
| 103 | 15 | 111111111100111 |

| | | |
|---|---|---|
| 104 | 15 | 111111111101000 |
| 105 | 15 | 111111111101001 |
| 106 | 15 | 111111111101010 |
| 107 | 15 | 111111111101011 |
| 108 | 15 | 111111111101100 |
| 109 | 15 | 111111111101101 |
| 110 | 15 | 111111111101110 |
| 111 | 15 | 111111111101111 |
| 112 | 15 | 111111111110000 |
| 113 | 15 | 111111111110001 |
| 114 | 15 | 111111111110010 |
| 115 | 15 | 111111111110011 |
| 116 | 15 | 111111111110100 |
| 117 | 15 | 111111111110101 |
| 118 | 15 | 111111111110110 |
| 119 | 15 | 111111111110111 |
| 120 | 15 | 111111111111000 |
| 121 | 15 | 111111111111001 |
| 122 | 15 | 111111111111010 |
| 123 | 15 | 111111111111011 |
| 124 | 15 | 111111111111100 |
| 125 | 15 | 111111111111101 |
| 126 | 15 | 111111111111110 |
| 127 | 15 | 111111111111111 |

```
********************** PicTel Corporation *************************
*
*          PROPRIETARY AND COMPANY PRIVATE:  NOT FOR RELEASE
*
* MODULE:              INTEGER FUNCTION QUADCODE
*
* DESCRIPTION:  Performs quadtree coding of an NxN block, N=2**level.
*               Returns the top-level quadword value.
*
* PARAMETERS:
*        blk         INTEGER (bdim,2**level) Block to be coded.
*        bdim        INTEGER  First dimension of "blk". Facilitates
*                             in-place computations.
*        level       INTEGER  2-log of blocksize N
*        code_len    INTEGER (-cdim:cdim,0:level) Contains codeword
*                             lengths for the different levels in the hierarchy.
*        cdim        INTEGER  Max magnitude of codeword value
*   (*)  code_hist   INTEGER (-cdim:cdim,0:level) Codeword histograms;
*                             updated for every call.
*   (*)  bits        INTEGER  The number of used bits is added to this
*                             variable.
*        code_words  INTEGER (-cdim:cdim,0:level) Contains codewords
*                             for the different levels in the hierarchy.
*   (*)  words       INTEGER (4**(level+1) /3) Returns the codewords;
*                             the words must be transmitted in reverse order.
*   (*)  lengths     INTEGER (4**(level+1) /3) Returns the corresponding
*                             codeword lengths.
*   (*)  ncodes      INTEGER; Should be set to zero when calling.
*                             Returns number of codewords generated.
*
* ROUTINES REQUIRED:
*      QUADWORD           - Generate zero/non-zero indication for 4
*                           integer values. (This file)
*
* AUTHOR:     Staffan Ericsson
*
* DATE CREATED: June 16, 1985
*
* MODIFIED BY:
*      S Ericsson July 25, 1985:  Generating the codewords to
*                 produce bit stream.
*
```

APPENDIX F

```
*
*    This is what we really want to do, if recursive functions
*    were available.
*
*    INTEGER FUNCTION QUADCODE (blk,bdim, level, code_len, cdim,
*   -         code_hist, bits, code_words, words, lengths, ncodes)
*    IMPLICIT NONE
*    INTEGER bdim, level, cdim, bits, blk(0:bdim-1, 0:2**level-1),
*   -         code_len(-cdim:cdim, 0:level),
*   -         code_hist(-cdim:cdim, 0:level),
*   -         code_words(-cdim:cdim, 0:level),
*   -         words(*), lengths(*), ncodes,
*   -         nextlev, nextsize,
*   -         QUADWORD, QUADCODE
*
*    IF (level .EQ. 0) THEN
*       QUADCODE = blk(0,0)
*    ELSE IF (level .GT. 0) THEN
*       nextlev = level - 1
*       nextsize = 2**nextlev
*       QUADCODE = QUADWORD (QUADCODE (blk(0,0), bdim, nextlev,
*   -                  code_len, cdim, code_hist, bits,
*   -                  code_words, words, lengths, ncodes),
*   -            QUADCODE (blk(nextsize,0), bdim, nextlev,
*   -                  code_len, cdim, code_hist, bits,
*   -                  code_words, words, lengths, ncodes),
*   -            QUADCODE (blk(0,nextsize), bdim, nextlev,
*   -                  code_len, cdim, code_hist, bits,
*   -                  code_words, words, lengths, ncodes),
*   -            QUADCODE (blk(nextsize,nextsize), bdim, nextlev,
*   -                  code_len, cdim, code_hist, bits,
*   -                  code_words, words, lengths, ncodes) )
*    ELSE
*       STOP 'QUADCODE -- level < 0'
*    END IF
*    IF (code_len (QUADCODE, level) .NE. 0) THEN
*       ncodes = ncodes + 1
*       words(ncodes) = code_words (QUADCODE, level)
*       lengths(ncodes) = code_len (QUADCODE, level)
*       bits = bits + code_len (QUADCODE, level)
*    END IF
*    code_hist(QUADCODE,level) = code_hist(QUADCODE,level) + 1
*
*    RETURN
*    END
*
*    But in FORTRAN we write 4 almost identical functions:
********************* Top level function *********************
      INTEGER FUNCTION QUADCODE (blk,bdim, level, code_len, cdim,
     -         code_hist, bits, code_words, words, lengths, ncodes)
      IMPLICIT NONE
      INTEGER bdim, level, cdim, bits, blk(0:bdim-1, 0:2**level-1),
     -         code_len(-cdim:cdim, 0:level),
     -         code_hist(-cdim:cdim, 0:level),
     -         code_words(-cdim:cdim, 0:level),
     -         words(*), lengths(*), ncodes,
     -         nextlev, nextsize,
     -         QUADWORD, QUADCODE2

IF (level .EQ. 0) THEN
         QUADCODE = blk(0,0)
      ELSE IF (level .GT. 0) THEN
         nextlev = level - 1
```

```
        nextsize = 2**nextlev
        QUADCODE = QUADWORD (QUADCODE2 (blk(0,0), bdim, nextlev,
                      code_len, cdim, code_hist, bits,
                      code_words, words, lengths, ncodes),
                  QUADCODE2 (blk(nextsize,0), bdim, nextlev,
                      code_len, cdim, code_hist, bits,
                      code_words, words, lengths, ncodes),
                  QUADCODE2 (blk(0,nextsize), bdim, nextlev,
                      code_len, cdim, code_hist, bits,
                      code_words, words, lengths, ncodes),
                  QUADCODE2 (blk(nextsize,nextsize), bdim, nextlev,
                      code_len, cdim, code_hist, bits,
                      code_words, words, lengths, ncodes) )
     ELSE
        STOP 'QUADCODE -- level < 0'
     END IF
     IF (code_len (QUADCODE, level) .NE. 0) THEN
        ncodes = ncodes + 1
        words(ncodes) = code_words (QUADCODE, level)
        lengths(ncodes) = code_len (QUADCODE, level)
        bits = bits + code_len (QUADCODE, level)
     END IF
     code_hist(QUADCODE,level) = code_hist(QUADCODE,level) + 1

RETURN
     END
******************** Lower level function ***********************
     INTEGER FUNCTION QUADCODE2 (blk,bdim, level, code_len, cdim,
            code_hist, bits, code_words, words, lengths, ncodes)
     IMPLICIT NONE
     INTEGER bdim, level, cdim, bits, blk(0:bdim-1, 0:2**level-1),
            code_len(-cdim:cdim, 0:level),
            code_hist(-cdim:cdim, 0:level),
            code_words(-cdim:cdim, 0:level),
            words(*), lengths(*), ncodes,
            nextlev, nextsize,
            QUADWORD, QUADCODE3

IF (level .EQ. 0) THEN
        QUADCODE2 = blk(0,0)
     ELSE IF (level .GT. 0) THEN
        nextlev = level - 1
        nextsize = 2**nextlev
        QUADCODE2 = QUADWORD (QUADCODE3 (blk(0,0), bdim, nextlev,
                      code_len, cdim, code_hist, bits,
                      code_words, words, lengths, ncodes),
                  QUADCODE3 (blk(nextsize,0), bdim, nextlev,
                      code_len, cdim, code_hist, bits,
                      code_words, words, lengths, ncodes),
                  QUADCODE3 (blk(0,nextsize), bdim, nextlev,
                      code_len, cdim, code_hist, bits,
                      code_words, words, lengths, ncodes),
                  QUADCODE3 (blk(nextsize,nextsize), bdim, nextlev,
                      code_len, cdim, code_hist, bits,
                      code_words, words, lengths, ncodes) )
     ELSE
        STOP 'QUADCODE2 -- level < 0'
     END IF
     IF (code_len (QUADCODE2, level) .NE. 0) THEN
        ncodes = ncodes + 1
        words(ncodes) = code_words (QUADCODE2, level)
        lengths(ncodes) = code_len (QUADCODE2, level)
        bits = bits + code_len (QUADCODE2, level)
     END IF
     code_hist(QUADCODE2,level) = code_hist(QUADCODE2,level) + 1
     RETURN
     END
```

********************** Lower level function **********************
```
      INTEGER FUNCTION QUADCODE3 (blk,bdim, level, code_len, cdim,
-             code_hist, bits, code_words, words, lengths, ncodes)
      IMPLICIT NONE
      INTEGER bdim, level, cdim, bits, blk(0:bdim-1, 0:2**level-1),
-             code_len(-cdim:cdim, 0:level),
-             code_hist(-cdim:cdim, 0:level),
-             code_words(-cdim:cdim, 0:level),
-             words(*), lengths(*), ncodes,
-             nextlev, nextsize,
-             QUADWORD, QUADCODE4

IF (level .EQ. 0) THEN
        QUADCODE3 = blk(0,0)
      ELSE IF (level .GT. 0) THEN
        nextlev = level - 1
        nextsize = 2**nextlev
        QUADCODE3 = QUADWORD (QUADCODE4 (blk(0,0), bdim, nextlev,
-                  code_len, cdim, code_hist, bits,
-                  code_words, words, lengths, ncodes),
             QUADCODE4 (blk(nextsize,0), bdim, nextlev,
-                  code_len, cdim, code_hist, bits,
-                  code_words, words, lengths, ncodes),
             QUADCODE4 (blk(0,nextsize), bdim, nextlev,
-                  code_len, cdim, code_hist, bits,
-                  code_words, words, lengths, ncodes),
             QUADCODE4 (blk(nextsize,nextsize), bdim, nextlev,
-                  code_len, cdim, code_hist, bits,
-                  code_words, words, lengths, ncodes) )
-     ELSE
        STOP 'QUADCODE3 --  level < 0'
      END IF
      IF (code_len (QUADCODE3, level)  .NE. 0) THEN
        ncodes = ncodes + 1
        words(ncodes) = code_words (QUADCODE3, level)
        lengths(ncodes) = code_len (QUADCODE3, level)
        bits = bits + code_len (QUADCODE3, level)
      END IF
      code_hist(QUADCODE3,level) = code_hist(QUADCODE3,level) + 1

RETURN
      END
```
********************** Lowest level function **********************
```
      INTEGER FUNCTION QUADCODE4 (blk,bdim, level, code_len, cdim,
-             code_hist, bits, code_words, words, lengths, ncodes)
      IMPLICIT NONE
      INTEGER bdim, level, cdim, bits, blk(0:bdim-1, 0:2**level-1),
-             code_len(-cdim:cdim, 0:level),
-             code_hist(-cdim:cdim, 0:level),
-             code_words(-cdim:cdim, 0:level),
-             words(*), lengths(*), ncodes,
-             nextlev, nextsize,
-             QUADWORD, QUADCODE3

IF (level .EQ. 0) THEN
        QUADCODE4 = blk(0,0)
      ELSE IF (level .GT. 0) THEN
        STOP 'QUADCODE -- Max nesting depth is 4'
      ELSE
        STOP 'QUADCODE4 --  level < 0'
      END IF
      IF (code_len (QUADCODE4, level)  .NE.  0) THEN
        ncodes = ncodes + 1
        words(ncodes) = code_words (QUADCODE4, level)
        lengths(ncodes) = code_len (QUADCODE4, level)
        bits = bits + code_len (QUADCODE4, level)
```

```
         END IF
         code_hist(QUADCODE4,level) = code_hist(QUADCODE4,level) + 1

RETURN
         END
* quadword - generate zero/non-zero indication for 4 integer values;
*          output is between 0 and 15.
         INTEGER FUNCTION QUADWORD (n1, n2, n3, n4)
         IMPLICIT NONE
         INTEGER n1, n2, n3, n4

IF (n1.NE.0) THEN
            QUADWORD = 8
         ELSE
            QUADWORD = 0
         END IF
         IF (n2.NE.0)  QUADWORD = QUADWORD + 4
         IF (n3.NE.0)  QUADWORD = QUADWORD + 2
         IF (n4.NE.0)  QUADWORD = QUADWORD + 1

RETURN
         END
************************* PicTel Corporation ************************
*
*        PROPRIETARY AND COMPANY PRIVATE:  NOT FOR RELEASE
*
* MODULE:           SUBROUTINE QUAD_DECODE
*
* DESCRIPTION:      Perform decoding of one block of quadtree coded
*                   information.
*
* PARAMETERS:
*        level             INTEGER   2-log of blocksize N
*        amp_dtable        INTEGER   Amplitude decoding table with 256
*                                    entries; generated by subr. "create_codewords".
*        quad_dtable       INTEGER   Quadtree addressing decoding table,
*                                    one for each level.
*        bdim              INTEGER   First dimension of "blk". Facilitates
*                                    in-place computations.
*   (*) blk                INTEGER (bdim,2**level)  The 8x8 block should be
*                                    set to zero when calling; returns the decoded
*                                    information.
*
* ROUTINES REQUIRED:
*        UNCODE_VLC        - Decode variable length code word
*
* AUTHOR:     Staffan Ericsson
*
* DATE CREATED: July 25, 1985
*
* MODIFIED BY:
*
                              APPENDIX G
*
*        This is what we really want to do, if recursive functions
*        were available.
*
*        SUBROUTINE quad_decode (level, amp_dtable, quad_dtable, bdim,blk)
*        IMPLICIT NONE
*        INCLUDE 'CODES.CMN/LIST'
*        INTEGER bdim, level, blk(0:bdim-1, 0:2**level-1),
*     -          amp_dtable(2,0:255,2), quad_dtable(2,0:255,level),
*     -          nextlev, nextsize, quadword,
*     -          UNCODE_VLC
*
```

```
*       IF (level .EQ. 0) THEN
*         blk(0,0) = UNCODE_VLC (amp_dtable, 8,2)
*       ELSE IF (level .GT. 0) THEN
*         nextlev = level - 1
*         nextsize = 2**nextlev
*         quadword = UNCODE_VLC (quad_dtable(1,0,level), 8,1)
*         IF (IAND(quadword,1) .NE. 0) THEN
*           CALL quad_decode (nextlev, amp_dtable, quad_dtable, bdim,
*                             blk(nextsize,nextsize))
*         END IF
*         IF (IAND(quadword,2) .NE. 0) THEN
*           CALL quad_decode (nextlev, amp_dtable, quad_dtable, bdim,
*                             blk(0,nextsize))
*         END IF
*         IF (IAND(quadword,4) .NE. 0) THEN
*           CALL quad_decode (nextlev, amp_dtable, quad_dtable, bdim,
*                             blk(nextsize,0))
*         END IF
*         IF (IAND(quadword,8) .NE. 0) THEN
*           CALL quad_decode (nextlev, amp_dtable, quad_dtable, bdim,
*                             blk(0,0))
*         END IF
*       ELSE
*         STOP 'QUAD_DECODE -- level < 0'
*       END IF
*
*       RETURN
*       END
*
*       But in FORTRAN we write 4 almost identical functions:
*
********************** Top level function ***********************
        SUBROUTINE quad_decode (level, amp_dtable, quad_dtable, bdim,blk)
        IMPLICIT NONE
        INCLUDE 'CODES.CMN/LIST'
        INTEGER bdim, level, blk(0:bdim-1, 0:2**level-1),
     -          amp_dtable(2,0:255,2), quad_dtable(2,0:255,level+1),
* Dirty fix: "quad_dtable" is declared to have one extra table, so that
*            we can use the same routine on the bottom level although there
*            isn't really any quad_dtable available there.
     -          nextlev, nextsize, quadword,
     -          UNCODE_VLC IF (level .EQ. 0) THEN
          blk(0,0) = UNCODE_VLC (amp_dtable, 8,2)
        ELSE IF (level .GT. 0) THEN
          nextlev = level - 1
          nextsize = 2**nextlev
          quadword = UNCODE_VLC (quad_dtable(1,0,level), 8,1)
          IF (IAND(quadword,1) .NE. 0) THEN
            CALL quad_decode2 (nextlev, amp_dtable, quad_dtable, bdim,
     -                         blk(nextsize,nextsize))
          END IF
          IF (IAND(quadword,2) .NE. 0) THEN
            CALL quad_decode2 (nextlev, amp_dtable, quad_dtable, bdim,
     -                         blk(0,nextsize))
          END IF
          IF (IAND(quadword,4) .NE. 0) THEN
            CALL quad_decode2 (nextlev, amp_dtable, quad_dtable, bdim,
     -                         blk(nextsize,0))
          END IF
          IF (IAND(quadword,8) .NE. 0) THEN
            CALL quad_decode2 (nextlev, amp_dtable, quad_dtable, bdim,
     -                         blk(0,0))
          END IF
        ELSE
```

```
              STOP 'QUAD_DECODE --  level < 0'
           END IF

RETURN
           END
*******************  Lower level function  ***********************
        SUBROUTINE quad_decode2 (level, amp_dtable, quad_dtable, bdim,blk)
        IMPLICIT NONE
        INCLUDE 'CODES.CMN/LIST'
        INTEGER bdim, level, blk(0:bdim-1, 0:2**level-1),
     -          amp_dtable(2,0:255,2), quad_dtable(2,0:255,level+1),
     -          nextlev, nextsize, quadword,
     -          UNCODE_VLC IF (level .EQ. 0) THEN
           blk(0,0) = UNCODE_VLC (amp_dtable, 8,2)
        ELSE IF (level .GT. 0) THEN
           nextlev = level - 1
           nextsize = 2**nextlev
           quadword = UNCODE_VLC (quad_dtable(1,0,level), 8,1)
           IF (IAND(quadword,1) .NE. 0) THEN
              CALL quad_decode3 (nextlev, amp_dtable, quad_dtable, bdim,
     -                           blk(nextsize,nextsize))
           END IF
           IF (IAND(quadword,2) .NE. 0) THEN
              CALL quad_decode3 (nextlev, amp_dtable, quad_dtable, bdim,
     -                           blk(0,nextsize))
           END IF
           IF (IAND(quadword,4) .NE. 0) THEN
              CALL quad_decode3 (nextlev, amp_dtable, quad_dtable, bdim,
     -                           blk(nextsize,0))
           END IF
           IF (IAND(quadword,8) .NE. 0) THEN
              CALL quad_decode3 (nextlev, amp_dtable, quad_dtable, bdim,
     -                           blk(0,0))
           END IF
        ELSE
           STOP 'QUAD_DECODE2 --  level < 0'
        END IF RETURN
        END
*******************  Lower level function  ***********************
        SUBROUTINE quad_decode3 (level, amp_dtable, quad_dtable, bdim,blk)
        IMPLICIT NONE
        INCLUDE 'CODES.CMN/LIST'
        INTEGER bdim, level, blk(0:bdim-1, 0:2**level-1),
     -          amp_dtable(2,0:255,2), quad_dtable(2,0:255,level+1),
     -          nextlev, nextsize, quadword,
     -          UNCODE_VLC IF (level .EQ. 0) THEN
           blk(0,0) = UNCODE_VLC (amp_dtable, 8,2)
        ELSE IF (level .GT. 0) THEN
           nextlev = level - 1
           nextsize = 2**nextlev
           quadword = UNCODE_VLC (quad_dtable(1,0,level), 8,1)
           IF (IAND(quadword,1) .NE. 0) THEN
              CALL quad_decode4 (nextlev, amp_dtable, quad_dtable, bdim,
     -                           blk(nextsize,nextsize))
           END IF
           IF (IAND(quadword,2) .NE. 0) THEN
              CALL quad_decode4 (nextlev, amp_dtable, quad_dtable, bdim,
     -                           blk(0,nextsize))
           END IF
           IF (IAND(quadword,4) .NE. 0) THEN
```

```
                CALL quad_decode4 (nextlev, amp_dtable, quad_dtable, bdim,
                                   blk(nextsize,0))
            END IF
            IF (IAND(quadword,8) .NE. 0) THEN
                CALL quad_decode4 (nextlev, amp_dtable, quad_dtable, bdim,
                                   blk(0,0))
            END IF
         ELSE
            STOP 'QUAD_DECODE3 --  level < 0'
         END IF RETURN
         END
******************* Lowest level function ***********************
         SUBROUTINE quad_decode4 (level, amp_dtable, quad_dtable, bdim,blk)
         IMPLICIT NONE
         INCLUDE 'CODES.CMN/LIST'
         INTEGER bdim, level, blk(0:bdim-1, 0:2**level-1),
     -           amp_dtable(2,0:255,2), quad_dtable(2,0:255,level+1),
     -           nextlev, nextsize, quadword,
     -           UNCODE_VLC IF (level .EQ. 0) THEN
            blk(0,0) = UNCODE_VLC (amp_dtable, 8,2)
         ELSE IF (level .GT. 0) THEN
            STOP 'QUAD_DECODE4 -- Max nesting depth is 4'
         ELSE
            STOP 'QUAD_DECODE4 --  level < 0'
         END IF

RETURN
         END
```

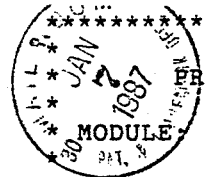

```
*************** PicTel Corporation ***********************
* PROPRIETARY AND COMPANY PRIVATE:    NOT FOR RELEASE
*
* MODULE:          INTEGER FUNCTION UNCODE_VLC
*
* DESCRIPTION:     UNCODE_VLC decodes a variable length word and returns
*                  the decoded value.
*
* PARAMETERS:
*       table      INTEGER (2, 2**bits, ntabs); Decoding table containing
*                  pairs of entries: the first is the decoded value,
*                  the second is the codeword length. A negative length
*                  indicates that the next decoding table shall be used,
*                  and the absolute value indicates number of bits
*                  to discard before entering the next table.
*       bits       INTEGER  Indicates size of decoding table
*       ntabs      INTEGER  Number of tables. Example: ntabs=2 indicates
*                  that one extension table is available to handle the
*                  decoding of words longer than "bits".
*
*
* ROUTINES REQUIRED:
*       UNCODE    - Extract bits from the bit stream 'codes'
*
* AUTHOR:          Staffan Ericsson
*
* DATE CREATED: July 25, 1985
*
* MODIFIED BY:
*
```

APPENDIX H

```
INTEGER FUNCTION uncode_vlc (table, bits, ntabs)
IMPLICIT NONE
INTEGER bits, ntabs, table(2, 0:2**bits-1, ntabs)
INTEGER dpoint_save, codeword, length, itab
INCLUDE 'CODES.CMN/LIST' itab = 1
DO WHILE (itab .EQ. 1 .OR. length .LT. 0)
  dpoint_save = dpoint
  CALL uncode (codeword, bits)
  IF (itab .GT. ntabs) STOP 'UNCODE_VLC -- No code ext. available'
  uncode_vlc = table(1, codeword, itab)
  length = table(2, codeword, itab)
  IF (length .GE. 0) THEN
     dpoint = dpoint_save + length
  ELSE
     dpoint = dpoint_save - length
  END IF
  itab = itab + 1
END DO
RETURN
END
```

What is claimed is:

1. A method for encoding transform coefficient data associated with the transform of an image frame, the coefficient data being represented in a two-dimensional array, the method comprising the steps of
identifying those coefficients of the coefficient data associated with the transform which will be transmitted to a receiver,
quad-tree encoding the array locations of those coefficients which will be transmitted, and
encoding, using a variable length coding procedure, the quad-tree data code words.

2. The method of claim 1 further wherein said identifying step comprises the step of
subjecting said coefficients to a thresholding and quantizing process for reducing the number of coefficient data bits to be transmitted, and
whereby the coefficient data of said image is represented by fewer data bits as quantizer step size increases.

3. The method of claim 2 further comprising the steps of
subjecting said coefficients to a thresholding process for reducing the coefficient data transmitted,
whereby the coefficient data of said image is represented by fewer data bits as the threshold level increases.

4. The method of claim 1 further comprising the step of
encoding, using a variable length coding procedure, the value of the transform coefficient data for each quad-tree data code word identified array location.

5. The method of claim 1 wherein said quad tree encoding step comprises the steps of
assigning a selected number of bits to said quad tree encoding step,
performing said quad tree encoding of the transform coefficients from low to high frequency representing components, and
terminating said quad-tree encoding when said selected number of code bits has been exhausted.

6. The method of claim 1 further comprising the step of
decoding, at a receiving station, the variable length coded data, said decoding step comprising the steps of
applying a received data stream to a first and a second lookup table, said first lookup table being responsive to a first number of sequentially received bits of each variable length code word beginning at the first bit of each word, said number of bits being less than the length of the longest variable length code word, and said second lookup table being responsive to a second number of sequentially received bits of each variable length code word beginning after the first bit of each word, said second number of bits being less than the length of the longest variable length code word, and the sum of said first number and said second number being at least equal to the length of the longest variable length code word,
setting a flag whenever said variable length code word cannot be decoded using only the first lookup table, and
decoding said variable length code word using said second lookup table whenever said flag is set and using said first table only when there is no flag.

7. The method of claim 6 wherein said setting step comprises the step of
responding to a unique code word output of said first lookup table for setting said flag.

8. The method of claim 6 wherein said setting step comprises the step of
responding to a flag enable output of said first lookup table for setting said flag.

9. The method of claim 1 further comprising the step of
predicting a quantization step size for an image from available image statistics, and prior to encoding said image.

10. The method of claim 9 wherein said predicting step comprises the step of
selecting said quantization step size based upon the quantization step size for the previous image, the number of blocks completely coded in the previous image, a minimum number of blocks to be coded for this image, a total prediction error energy for this image and a total prediction error energy for the previous image.

11. An apparatus for encoding transform coefficient data associated with the transform of an image frame, the coefficient data being represented in a two-dimensional array, said apparatus comprising
means for identifying those coefficients of the coefficient data associated with the transform which will be transmitted to a receiver,
encoding means for quad-tree coding the array locations of those coefficients which will be transmitted, and
means for variable length coding the quad-tree data code words.

12. The apparatus of claim 11 further wherein said identifying means comprises
means for subjecting said coefficients to a quantizing process for reducing the number of coefficient data bits to be transmitted,
whereby the coefficient data of said image is represented by fewer data bits as quantizer step size increases.

13. The apparatus of claim 12 further comprising means for subjecting said coefficients to a thresholding process for reducing the coefficient data transmitted,
whereby the coefficient data of said image is represented by fewer data bits as the threshold level increases.

14. The apparatus of claim 11 further comprising means for variable length coding the value of the transform coefficient data for each quad-tree data identified array location.

15. The apparatus of claim 11 wherein said quad tree encoding means comprises
means for assigning a selected number of bits to said quad tree encoding step,
means for performing said quad tree encoding of transform coefficients from low to high frequency representing components, and
means for terminating operation of said encoding means when said selected number of bits has been exhausted.

16. The apparatus of claim 11 further comprising means for decoding, at a receiving station, the variable length coded data, said decoding means comprising
means for applying a received data stream to a first and a second lookup table, said first lookup table being responsive to a first number of sequentially received bits of each variable length code word beginning at the first bit of each word, said number of bits being less than the length of the longest variable length code word, and said second lookup table being responsive to a second number of sequentially received bits of each variable length code word beginning after the first bit of each word, said second number of bits being less than the length of the longest variable length code word, and the sum of said first number and said second number being at least equal to the length of the longest variable length code word,
means for setting a flag whenever said variable length code word cannot be decoded using only the first lookup table, and
means for decoding said variable length code word using said second lookup table whenever said flag is set and using said first table only when there is no flag.

17. The apparatus of claim 16 wherein said setting means comprises
means for responding to a unique code word output of said first lookup table for setting said flag.

18. The apparatus of claim 16 wherein said setting means comprises
means for responding to a flag enable output of said first lookup table for setting said flag.

19. The apparatus of claim 11 further comprising the step of
means for predicting a quantization step size for an image from available image statistics, and prior to encoding said image.

20. The apparatus of claim 19 wherein said predicting means comprises
means for selecting said quantization step size based upon the quantization step size for the previous image, the number of blocks completely coded in the previous image, a minimum number of blocks to be coded for this image, a total prediction error energy for this image and a total prediction error energy for the previous image.

21. A method for decoding a variable length coded data stream comprising the steps of
applying a received data stream to a plurality of lookup tables, a first lookup table being responsive to a first number of sequentially received bits of each variable length code word beginning at the first bit of each word, said number of bits being less than the length of the longest variable length code word, and each other lookup table being responsive to at least part of a second number of sequentially received bits of each variable length code word beginning after the first bit of each word, said second number of bits being less than the length of the longest variable length code word, and the sum of said first number and said second number being at least equal to the length of the longest variable length code word,
setting a flag whenever said variable length code word cannot be decoded using only the first lookup table, and
decoding said variable length code word using said other lookup tables whenever said flag is set and using said first table only when there is no flag.

22. The method of claim 21 wherein there are two lookup tables.

23. A method for encoding motion estimation transform data representing the motion of each of a plurality of blocks representing an image frame in a time sequence of image frames, said transform data for each block being arranged in a two dimensional array, each block having associated therewith motion transform data representing the motion estimate for that block, said method comprising the steps of
identifying those blocks for which motion estimation transform data will be transmitted,
quad-tree encoding the locations of those blocks for which motion estimation data will be transmitted, and
encoding, using a variable length coding procedure, the quad-tree data code words.

24. Apparatus for encoding motion estimation transform data representing the motion of each of a plurality of blocks representing an image frame in a time sequence of image frames, said transform data for each block being arranged in a two dimensional array, each block having associated therewith motion data representing the motion estimate for that block, said apparatus comprising means for identifying those blocks for which motion estimation transform data will be transmitted, quad-tree encoding means for coding the locations of those blocks for which motion estimation transform data will be transmitted, and means for variable length coding the quad-tree data code words.

25. Apparatus for decoding a variable length coded data stream comprising means for applying a received data stream to a plurality of lookup tables, a first lookup table being responsive to a first number of sequentially received bits of each variable length code word beginning at the first bit of each word, said number of bits being less than the length of the longest variable length code word, and each other lookup table being responsive to at least part of a second number of sequentially received bits of each variable length code word beginning after the first bit of each word, said second number of bits being less than the length of the longest variable length code word, and the sum of said first number and said second number being at least equal to the length of the longest variable length code word, means for setting a flag whenever said variable length code word cannot be coded using only the first lookup table, and means for decoding said variable length code word using said other lookup tables whenever said flag is set and using said first table only when there is no flag.

26. The apparatus of claim 25 wherein there are two lookup tables.

27. A method for encoding transform data for a plurality of blocks associated with an image frame in a time sequence of image frames, said method comprising the steps of transform coding data associated with said image frame for generating a plurality of transform coefficients; and predicting a quantization step size for said transform coefficients from image statistics, and prior to encoding said image.

28. The method of claim 27 wherein said predicting step comprises the step of selecting said quantization step size based upon the quantization step size for the previous image, the number of blocks completely coded in the previous image, a minimum number of blocks to be coded for this image, a total prediction error energy for this image and a total prediction error energy for the previous image.

29. Apparatus for encoding transform data for a plurality of blocks associated with an image frame in a time sequence of image frames, said apparatus comprising means for transform coding data associated with said image frame for generating a plurality of transform coefficients; and means for predicting a quantization step size for said transform coefficients from image statistics, and prior to encoding said image.

30. The apparatus of claim 29 wherein said predicting means comprises means for selecting said quantization step size based upon the quantization step size for the previous image, the number of blocks completely coded in the previous image, a minimum number of blocks to be coded for this image, a total prediction error energy for this image and a total prediction error energy for the previous image.

* * * * *